(12) United States Patent
Menke et al.

(10) Patent No.: US 12,133,415 B2
(45) Date of Patent: Oct. 29, 2024

(54) ORGANIC LIGHT EMITTING DIODE DISPLAY WITH COLOR-CORRECTION COMPONENT

(71) Applicant: 3M INNOVATIVE PROPERTIES COMPANY, St. Paul, MN (US)

(72) Inventors: Stephen M. Menke, St. Paul, MN (US); Nicholas C. Erickson, St. Paul, MN (US); Jathan D. Edwards, Afton, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 331 days.

(21) Appl. No.: 17/603,104

(22) PCT Filed: Mar. 24, 2020

(86) PCT No.: PCT/IB2020/052774
§ 371 (c)(1),
(2) Date: Oct. 12, 2021

(87) PCT Pub. No.: WO2020/212777
PCT Pub. Date: Oct. 22, 2020

(65) Prior Publication Data
US 2022/0123267 A1    Apr. 21, 2022

Related U.S. Application Data

(60) Provisional application No. 62/835,726, filed on Apr. 18, 2019.

(51) Int. Cl.
*H01L 51/52*    (2006.01)
*H10K 50/854*    (2023.01)
(Continued)

(52) U.S. Cl.
CPC .......... *H10K 50/854* (2023.02); *H10K 59/12* (2023.02); *H10K 2102/351* (2023.02)

(58) Field of Classification Search
CPC ................ H10K 50/854; H10K 59/12; H10K 2102/351; H10K 50/858
See application file for complete search history.

(56) References Cited

U.S. PATENT DOCUMENTS

| 5,882,774 A | 3/1999 | Jonza |
| 6,005,137 A | 12/1999 | Moore |

(Continued)

FOREIGN PATENT DOCUMENTS

| JP | 2005072002 A | 3/2005 |
| JP | 2007311046 A | 11/2007 |

(Continued)

OTHER PUBLICATIONS

Yang, "Group contribution to molar refraction and refractive index of conjugated polymers", Chemistry of Material, 1995, vol. 7, pp. 1276-1285.
(Continued)

*Primary Examiner* — Mohammed R Alam
(74) *Attorney, Agent, or Firm* — Clifton F. Richardson

(57) ABSTRACT

An organic light emitting diode (OLED) display is described, and includes a pixelated OLED display panel including N a plurality of pixels, each pixel including a plurality of subpixels, and each subpixel including a plurality of OLED layers. A hybrid color correction component is disposed on the pixelated OLED display panel, and the hybrid color-correction component includes a nanostructured interface and an angular transformation layer, the angular transformation layer is disposed between the nanostructured interface and the pixelated OLED display panel.

20 Claims, 18 Drawing Sheets

(51) Int. Cl.
  *H10K 59/12* (2023.01)
  *H10K 102/00* (2023.01)

(56) References Cited

U.S. PATENT DOCUMENTS

| | | |
|---|---|---|
| 6,179,948 B1 | 1/2001 | Merrill |
| 6,329,058 B1 | 12/2001 | Arney |
| 6,783,349 B2 | 8/2004 | Neavin |
| 8,460,568 B2 | 6/2013 | David |
| 8,557,378 B2 | 10/2013 | Yamanaka |
| 9,960,389 B1 | 5/2018 | Hao |
| 10,566,391 B2 | 2/2020 | Freier |
| 2005/0179373 A1 | 8/2005 | Kobayashi |
| 2007/0052345 A1 | 3/2007 | Wano |
| 2007/0236134 A1 | 10/2007 | Ho |
| 2009/0087629 A1 | 4/2009 | Everaerts |
| 2010/0028564 A1 | 2/2010 | Cheng |
| 2010/0040842 A1 | 2/2010 | Everaerts |
| 2010/0055810 A1 | 3/2010 | Sung |
| 2010/0110551 A1 | 5/2010 | Lamansky |
| 2010/0193790 A1 | 8/2010 | Yeo |
| 2010/0196669 A1 | 8/2010 | Hatakenaka |
| 2011/0126968 A1 | 6/2011 | Determan |
| 2011/0272849 A1 | 11/2011 | Neavin |
| 2014/0193612 A1 | 7/2014 | Yu |
| 2017/0084874 A1* | 3/2017 | Baker ................. H10K 50/854 |
| 2018/0081235 A1 | 3/2018 | Zhao |
| 2018/0088404 A1* | 3/2018 | Chae ...................... H10K 59/38 |
| 2019/0386251 A1 | 12/2019 | Erickson |

FOREIGN PATENT DOCUMENTS

| | | |
|---|---|---|
| JP | 2009217292 A | 9/2009 |
| JP | 2017113980 | 6/2017 |
| JP | 2017197604 | 11/2017 |
| WO | WO 2008-128073 | 10/2008 |
| WO | WO 2009-089137 | 7/2009 |
| WO | 2013035299 A1 | 3/2013 |
| WO | WO 2017-205174 | 11/2017 |
| WO | WO 2018-080830 | 5/2018 |
| WO | WO 2018-130926 | 7/2018 |
| WO | WO 2018-204648 | 11/2018 |
| WO | WO 2018-204675 | 11/2018 |
| WO | WO 2019-204078 | 10/2019 |

OTHER PUBLICATIONS

International Search report for PCT International Application No. PCT/IB2020/052774 mailed on Jun. 5, 2020, 4 pages.

\* cited by examiner

ORGANIC LIGHT EMITTING DIODE DISPLAY WITH COLOR-CORRECTION COMPONENT

BACKGROUND

Organic light emitting diode (OLED) displays, such as active-matrix organic light-emitting diode (AMOLED) displays, may produce a light output having a color that varies with view direction.

SUMMARY

In some aspects of the present disclosure, an organic light emitting diode (OLED) display is provided and includes a pixelated OLED display panel including a plurality of pixels, each pixel including a plurality of subpixels, each subpixel including a plurality of OLED layers, and a hybrid color correction component disposed on the pixelated OLED display panel. The hybrid color-correction component can include a nanostructured interface and an angular transformation layer, the angular transformation layer disposed between the nanostructured interface and the pixelated OLED display panel.

In some aspects of the present disclosure, an organic light emitting diode (OLED) display is provided and includes a pixelated OLED display panel including a plurality of pixels, each pixel including a plurality of subpixels, each subpixel including a plurality of OLED layers and a hybrid color correction component disposed on the pixelated OLED display panel. The hybrid color-correction component can include a nanostructured interface and an angular transformation layer, the angular transformation layer can be disposed between the nanostructured interface and the pixelated OLED display panel. A comparative OLED display panel, otherwise identical to the pixelated OLED display panel, can include comparative pixels having a maximum white-point color shift as a view angle varies from 0 to 45 degrees of $WPCS^{C}_{45}$ and a largest acceptable white-point color shift as view angle varies from 0 to 45 degrees of $WPCS^{LA}_{45}$, and where $WPCS^{C}_{45} < WPCS^{LA}_{45}$. The pixelated OLED display panel, when the hybrid color correction component is disposed on the pixelated OLED display panel, can include pixels having a maximum white-point color shift as view angle varies from 0 to 45 degrees of $WPCS_{45}$, and where $WPCS_{45} < WPCS^{C}_{45} - 0.005$.

In some aspects, the present disclosure provides an organic light emitting diode (OLED) display, including a pixelated OLED display panel including a plurality of pixels, each pixel including a plurality of subpixels, each subpixel including a plurality of OLED layers, and a hybrid color correction component disposed on the pixelated OLED display panel. The hybrid color-correction component can include a nanostructured interface and an angular transformation layer, the angular transformation layer can be disposed between the nanostructured interface and the pixelated OLED display panel. A comparative OLED display panel, otherwise identical to the pixelated OLED display panel, can include comparative pixels including comparative subpixels, each comparative subpixel having a maximum color shift as a view angle varies from 0 to 45 degrees of $SPCS^{C}_{45}$ and a largest acceptable subpixel color shift as view angle varies from 0 to 45 degrees of $SPCS^{LA}_{45}$, and where $SPCS^{C}_{45} < SPCS^{LA}_{45}$. The pixelated OLED display panel, when the hybrid color correction component is disposed on the pixelated OLED display panel, can include subpixels having a maximum color shift as view angle varies from 0 to 45 degrees of $SPCS_{45}$, and where $SPCS_{45} < SPCS^{C}_{45} - 0.005$.

DETAILED DESCRIPTION

Figure 1:
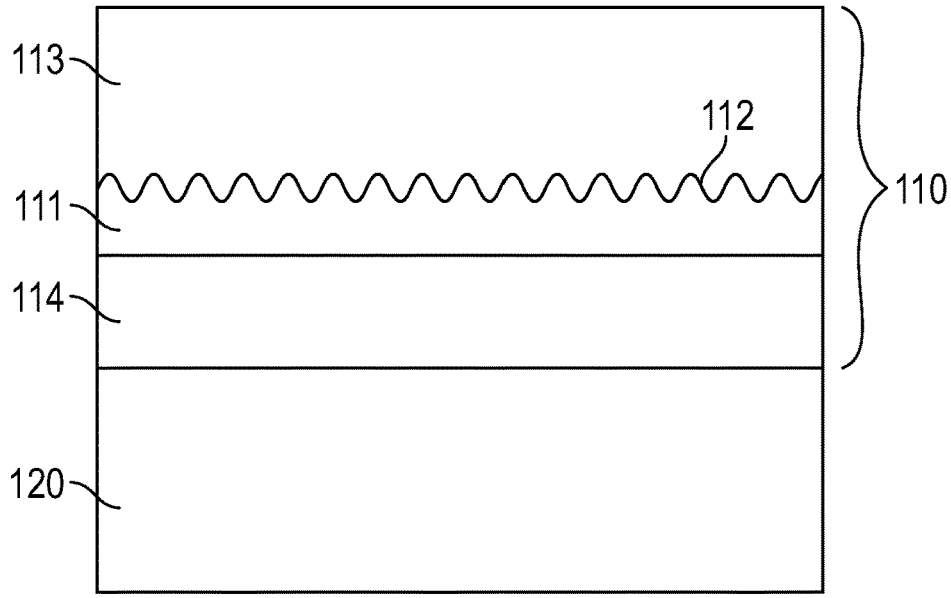
FIG. 1 is a diagram of a hybrid color correction component according to exemplary implementations of the present disclosure.

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

Organic light emitting diode (OLED) displays can produce a light output having a color that varies with view direction. This effect can be particularly objectionable in strong cavity OLEDs where a cavity between the cathode and anode of the emissive stack of the OLED has an output that depends on wavelength and view angle approximately as the cosine of the view angle in the cavity divided by the wavelength of the light in the cavity. The color shift and efficiency of the OLED display depends on design parameters of the OLED display. For example, both the color shift and the efficiency depend on the thickness and materials of layers of the OLED display. In conventional OLED displays, the OLED layers are chosen to achieve a desired compromise between color shift and efficiency.

As described in U.S. Pat. No. 10,566,391 (Freier et al.), U.S. Publication No. 2019/0386251 (Erickson et al.), PCT Publication Nos. WO 2017/205174 (Freier et al.) and WO 2019/204078 (Erickson et al.), a color-correction component, including a nanostructured interface, can be placed proximate an emissive layer of an OLED display panel to reduce the variation in color with view direction. The color-correction component can be placed adjacent a top surface of a top emitting OLED (TE-OLED) or adjacent a bottom surface of a bottom emitting OLED (BE-OLED). The OLED may be a strong-cavity OLED or a weak-cavity OLED or a no-cavity OLED. Current OLED markets are dominated by active-matrix organic light-emitting diode (AMOLED) displays, which have a top-emissive architecture and currently do not use any light extraction method except for employing a strong microcavity design. This strong cavity design can have high brightness efficiency, but the angular color uniformity is much worse than that of liquid crystal displays (LCDs), for example. In some embodiments of the present description, the color-correction component is advantageously used with a strong-cavity OLED, such as an AMOLED, because of the relatively large color shifts typically present in a strong-cavity OLED.

An OLED display often includes an array of pixels, and each pixel can includes several subpixels. Typically, each OLED subpixel emits red, blue or green light. In some cases, subpixels may be used which emit white, cyan, magenta, yellow or other colors of light. OLED subpixels include at least one, and oftentimes several, layers of organic material sandwiched between a cathode and an anode. The design of an OLED subpixel includes selecting the thickness, and optical and electronic properties of each layer so that the emitted light has the desired output. The OLED layer architecture is sometimes referred to as the "emissive stack" or OLED "stack."

In some embodiments, an OLED display includes an encapsulant which may include one or more layers disposed adjacent or proximate the emissive stack. Optionally, the emissive stack may contain one or more layers which are disposed between the cathode and the encapsulant. A circular polarizer may be disposed adjacent the encapsulant. In some cases, a touch sensor may be included in the OLED display. The touch sensor may optionally be included between the encapsulant and the circular polarizer.

The present disclosure describes a light emitting display, such as a TE-OLED or BE-OLED display, which contains a hybrid color correction component including an "Angular Transformation Layer," (ATL) which is configured between the emissive surface of an OLED subpixel and a color-correcting nanostructured interface.

FIG. 1 is a cross sectional view of an OLED display 100 including a hybrid color correction component 110. The hybrid color correction component 110 includes a nanostructured interface 112 between a first layer 111 and second layer 113 and an ATL 114. The hybrid color correction component is configured such that the ATL 114 is between the OLED stack 120 and the nanostructured interface 112.

In some embodiments the color-correcting nanostructured interface can be made of, or include, a first layer and a second layer, the first layer having a refractive index $n_1$, the second layer having a refractive index $n_2$. The first layer can be disposed between the ATL and the second layer. The nanostructured interface can be at the interface between the first and second layers. The nanostructured interface can be a topographical boundary between the first and second layers.

In some embodiments, the hybrid color-correction component is disposed between the encapsulant and the circular polarizer. In some embodiments the hybrid color-correction component is disposed between the encapsulant and the touch sensor.

The ATL serves to improve the function of the color-correcting nanostructure interface by changing the angular distribution of light emitted by the OLED which is subsequently incident upon the color-correcting nanostructure interface. The angular distribution of light in the ATL may be described by the ATL's internal angle of propagation which is determined, in part, by the ATL's refractive index or indices. By tuning the angular distribution of light incident upon the color-correcting nanostructure interface, the ability of the color-correcting nanostructure to improve angular brightness or color distribution may be enhanced. In some embodiments containing an ATL, the color-correcting nanostructure interface may enhance the extraction of light to the viewer. In some embodiments, the color-correcting nanostructured interface is designed to interact predominantly with the blue OLED subpixel while the ATL element is designed to interact with the light emission of more than one OLED subpixel.

The angle of propagation in the first layer, $\theta_1$, can be determined by Snell's law by the angle of propagation in the ATL, $\theta_{ATL}$, and the refractive index of the first layer, $n_1$, and the index of refraction of the ATL, $n_{ATL}$.

A preferred angular range incident upon the color correction nanostructure interface is $\theta_{1,1}$ to $\theta_{1,2}$. This angular range can be mapped to a preferred angular range exiting the ATL, $\theta_{ATL,1}$ to $\theta_{ATL,2}$ using Snell's law.

The intensity in the preferred angular range with the ATL is $I_P^{ATL}$. The intensity in the preferred angular range without the ATL is $I_P^0$.

In some embodiments, the ATL is tuned to redirect light into a preferred angular range such that $I_P^{ATL} > I_P^0$.

In some embodiments, the preferred angular ranges, $\theta_{1,1}$ to $\theta_{1,2}$, are 10 to 25, or 15 to 30, or 20 to 35 or 25 to 40 degrees.

In some embodiments, the ATL is tuned to redirect light traveling at a propagation angle in the absence of the ATL, $\theta_{prop}$, such that $\theta_{prop} > \theta_{ATL,2}$, into the preferred angular range $\theta_{ATL,1}$ to $\theta_{ATL,2}$. In some embodiments, the ATL is tuned to redirect light traveling at a propagation angle in the absence of the ATL, $\theta_{prop}$, such that $\theta_{prop} < \theta_{ATL,1}$, into the preferred angular range $\theta_{ATL,1}$ to $\theta_{ATL,2}$.

In some embodiments, the ATL is tuned to redirect high wavelength light with a wavelength, $\lambda$, and a propagation angle in the absence of the ATL, $\theta_0$, such that light with a greater than a largest acceptable wavelength, $\lambda_{LA}$, is redirected into larger propagation angles $\theta_0 > \theta_{ATL,2}$.

In various embodiments, the ATL can be a volumetric diffuser, or a surface diffuser, or can include an angular transformation nanostructured interface, or can include a multilayer optical film (MOF), or can include layers of particularly low index of refraction. It is to be understood that these ATL types can be combined without limitation.

There are several variables that can be used to quantify the reduction in the variation in color with view direction. For example, a shift in color with view angle from a specified color on axis can be used to characterize the color shift. It has been found that specifying a white axial color shift provides a useful quantity characterizing the overall color shift performance. A useful quantity to characterize the color shift is the maximum white-point color shift of the pixels of the display as the view angle varies from zero to 45 degrees ($WPCS_{45}$). Another quantity that is useful in characterizing the display is the maximum subpixel color shift for a given subpixel as a view angle varies from 0 to 45 degrees of ($SPCS_{45}$). The view angle refers to the angle relative to a direction normal to the display as determined in air external to the display. The corresponding angles relative to the normal direction in interior layers of the display can be determined by Snell's law. If the display is curved, the normal direction refers to the normal direction at the pixel emitting the light being characterized.

The white-point color shift with view angle can be described in terms of a CIE (Commission Internationale de l'Eclairage) 1976 UCS (Uniform Chromaticity Scale) chromaticity diagram. The white-point color shift at a specified view angle is the chromaticity distance between the light output at the specified view angle and the light output at a zero-degree (normal to the display) view angle when the light output at a zero-degree view angle is white. Chromaticity distance refers to the Euclidean distance between two points in the CIE chromaticity diagram. For example, if a first color has CIE 1976 UCS color coordinates ($u'_1$, $v'_1$) and a different second color has CIE 1976 UCS color coordinates ($u'_2$, $v'_2$), the chromaticity distance between the two colors is given by the positive square root of $(\Delta u'v')^2 = (u'_2 - u'_1)^2 + (v'_2 - v'_1)^2$. The white point at the normal viewing angle can be any suitable white point. For example, the white point can be taken to be the white point of a standard illuminant or can be taken to be the white point produced by the display panel. The white point can be specified in u',v' coordinates.

The subpixel color shift at a specified view angle is similarly defined as the chromaticity distance between the light output at the specified view angle and the light output at a zero-degree (normal to the display) view angle when the light output is from a given subpixel of the display.

It is also desired to characterize the brightness and/or the efficiency of the display. A useful quantity to characterize the on-axis brightness is the white-point axial efficiency of the pixels of the display (WPAE). Another quantity that is useful in characterizing the display is subpixel axial efficiency (SPAE). The SPAE is the efficiency of a given subpixel (e.g. red, green, blue, etc.) when the display produces a white light output. The lifetime of an OLED display is typically limited by the lifetime of the blue subpixels. Increasing the blue SPAE can therefore increase the lifetime of the OLED display. The efficiencies refer to the luminous intensity produced per unit of current supplied and can be expressed in cd/A.

It has been found that simultaneously designing the OLED stack and the hybrid color-correcting component, or designing the OLED stack based at least in part on properties of the hybrid color-correcting component, can provide performance benefits beyond what can be obtained by first designing the OLED stack to provide a desired compromise between color shift and efficiency and then using a hybrid color-correction component to further correct the color shift. According to some embodiments, the result of this is to create either a brighter display (e.g., higher WPAE or SPAE) or a more color uniform display (e.g. lower WPCS or SPCS) than conventional OLED displays.

Denote by $WPCS^0_{45}$ the maximum white-point color shift from 0 to 45 degrees of the display panel without the hybrid color-correcting component, $WPCS^C_{45}$ the maximum white-point color shift from 0 to 45 degrees of a comparative display panel, $WPCS_{45}$ the maximum white-point color shift from 0 to 45 degrees of the OLED display including the hybrid color-correcting component, $WPAE^0$ the white-point axial efficiency of the display panel without the hybrid color-correcting component, $WPAE^C$ the white-point axial efficiency of the comparative display panel, WPAE the white-point axial efficiency of the OLED display including the hybrid color-correcting component, $SPAE^C$ the subpixel axial efficiency of the comparative display panel, SPAE the subpixel axial efficiency of the OLED display including the hybrid color-correcting component, $SPCS^0_{45}$ the maximum subpixel color shift as a view angle varies from 0 to 45 degrees of the display panel without the hybrid color-correcting component, $SPCS^C_{45}$ the maximum subpixel color shift from 0 to 45 degrees of a comparative display panel, and $SPCS_{45}$ the maximum subpixel color shift from 0 to 45 degrees of the OLED display including the hybrid color-correcting component. It has been found, according to some embodiments, that designing an OLED stack to provide a less desirable or even ordinarily unacceptable white-point or subpixel color shift results in a performance improved in at least one way in $WPCS_{45}$-WPAE-$SPCS_{45}$-SPAE space (e.g., $WPCS_{45} < WPCS^C_{45}$ and/or $WPAE > WPAE^C$ and/or $SPAE > SPAE^C$ and/or $SPCS_{45} < SPCS^C_{45}$) when the hybrid color-correcting component is included.

Another advantage of the displays of present description is an improved tolerance to manufacturing variations, according to some embodiments. For example, according to some embodiments, it has been found that variations in layer thicknesses due to imperfect thickness control manufacturing, for example, results in variations in the performance in $WPCS_{45}$-WPAE that are significantly smaller for OLED displays incorporating a hybrid color-correction component than in conventional display panels.

Figure 2:
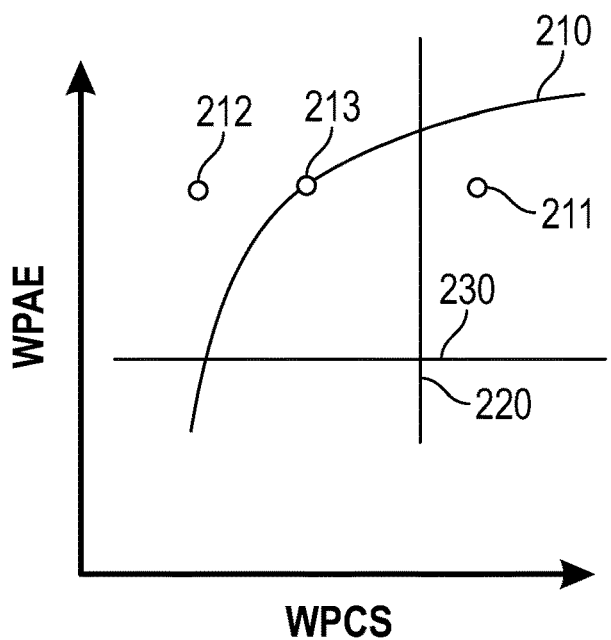
FIG. 2 is a schematic plot of a white-point axial efficiency versus white-point color shift performance space according to exemplary implementations of the present disclosure.

FIG. 2 is a plot schematically illustrating a performance space 200 in WPAE-WPCS$_{45}$ coordinates. The performance space 200 includes points on, or below and to the right of the performance curve 210. The performance curve 210 represents performance points achievable by varying one or more design parameters of the comparative display panels. Since comparative display panels, the display panels of the present description, and OLED displays including the display panels and hybrid color-correcting components of the present description can be illustrated on the same plot, the x- and y-axes of the plot will be referred to interchangeably as WPCS$^C_{45}$ WPAE$^C$ axes, WPCS$^0_{45}$-WPAE$^0$ axes, and WPCS$_{45}$—WPAE axes.

For a given OLED display panel, a plurality of comparative display panels can be defined which are otherwise equivalent to the OLED display panel except for one or more values of a plurality of stack design parameters. The comparative display panel define performance points in the WPCS$^C_{45}$-WPAE$^C$ space and define the performance curve 210 along the boundary of performance points. The performance curve 210 is the upper left-hand portion of the boundary of performance points. Different points along the performance curve 210 represent different performance results that can be realized by appropriate choices of the stack design parameters. If a performance point falls on the performance curve 210, there is no choice of the design parameters which results in a lower WPCS$^C_{45}$ without also lowering WPAE$^C$, or which results in a higher WPAE$^C$ without also increasing WPCS$^C_{45}$.

There is typically a largest acceptable maximum white-point color shift for view angles from 0 to 45 degrees of WPCS$^{LA}_{45}$ 220 and a minimum acceptable axial efficiency WPAE$^{Min}$ 230 that may depend on the application (e.g., one or both quantities may be different for cell phones than for televisions). In some embodiments, the plurality of comparative display panels has a range of WPCS$^C_{45}$ that extends both below and above WPCS$^{LA}_{45}$. In some embodiments, a range of WPCS$^C_{45}$ extends at least from 0.01 to 0.015. In some such embodiments, the range of WPCS$^C_{45}$ extends to at least 0.02, or at least from 0.009 to at 0.015, or at least from 0.008 to 0.02, for example. If one were to choose a performance point without reference to a hybrid color-correcting component, one would choose a point 213 along the performance curve 210 having a white-point axial efficiency greater than WPAE$^{Min}$ and having a maximum white-point color shift for view angles from 0 to 45 degrees less than WPCS$^{LA}_{45}$ In some embodiments the WPAE$^{Min}$ is at least 25 cd/A, or 30 cd/A, or 35 cd/A, or 40 cd/A.

According to the present description, it has been found that designing the OLED panel to consider the effects of the hybrid color-correction component can provide improved results compared to using a hybrid color-correction on a conventionally designed OLED panel. Since we are interested in optimizing the results for the display having the hybrid color-correction component disposed on the display panel, the optimum choice for the performance point of the display panel may be below and to the right of the performance curve 210, though in some cases it may also be on the performance curve 210.

For example, in some embodiments, performance point 211 for a display panel translates to performance point 212 when a hybrid color-correction component is included and no other performance points for the display panel results in a lower white-point color shift without also sacrificing another desired performance attribute such as efficiency. Note that performance point 211 is below and to the right of performance curve 210.

In some embodiments, the color-correction component shifts the maximum white-point color shift from 0 to 45 degrees of the display panel to the left by at least 0.005, or at least 0.01, or at least 0.015. In other words, in some embodiments, WPCS$^0_{45}$−WPCS$_{45}$≥0.005, or WPCS$^0_{45}$−WPCS$_{45}$≥0.01, or WPCS$^0_{45}$−WPCS$_{45}$≥0.015. In some embodiments, values of the design parameters of the OLED display panel are selected such that WPCS$^0_{45}$ is at least 0.012, or at least 0.015, or at least 0.016, or at least 0.017, or at least 0.018, or at least 0.019 or at least 0.02.

In some embodiments, the pixelated OLED display panel, with the hybrid color correction component disposed on the pixelated OLED display panel, has a maximum white-point color shift as view angle varies from 0 to 45 degrees of WPCS$_{45}$, and where WPCS$_{45}$<WPCS$^C_{45}$−0.005.

In some embodiments, the pixelated OLED display panel, without the hybrid color correction component disposed on the pixelated OLED display panel, has a maximum white-point color shift as view angle varies from 0 to 45 degrees of WPCS$^0_{45}$, and where WPCS$^0_{45}$>WPCS$^{LA}_{45}$. In some embodiments WPCS$^{LA}_{45}$ is 0.02, or 0.025, or 0.03.

In some embodiments, it is convenient to characterize the performance of the display and display panel in terms a plot of the subpixel axial efficiency versus the maximum subpixel color shift. For example, in some embodiments, an OLED display includes a pixelated OLED display panel including a plurality of pixels, each pixel including a plurality of subpixels, each subpixel including a plurality of OLED layers; and a hybrid color-correction component disposed on the pixelated OLED display panel, the color-correction component configured such that the display has a maximum blue-point color shift as a view angle varies from 0 to 45 degrees of BPCS$_{45}$ and a blue axial efficiency of BAE.

Denote by BPCS$^0_{45}$ the maximum blue subpixel color shift from 0 to 45 degrees of the display panel without the hybrid color-correcting component, BPCS$^C_{45}$ the maximum blue subpixel color shift from 0 to 45 degrees of a comparative display panel, BPCS$_{45}$ the maximum blue subpixel color shift from 0 to 45 degrees of the OLED display including the hybrid color-correcting component, BPAE$^0$ the blue subpixel axial efficiency of the display panel without the hybrid color-correcting component, BPAE$^C$ the blue subpixel axial efficiency of the comparative display panel, BPAE the blue subpixel axial efficiency of the OLED display including the hybrid color-correcting component.

Figure 3:
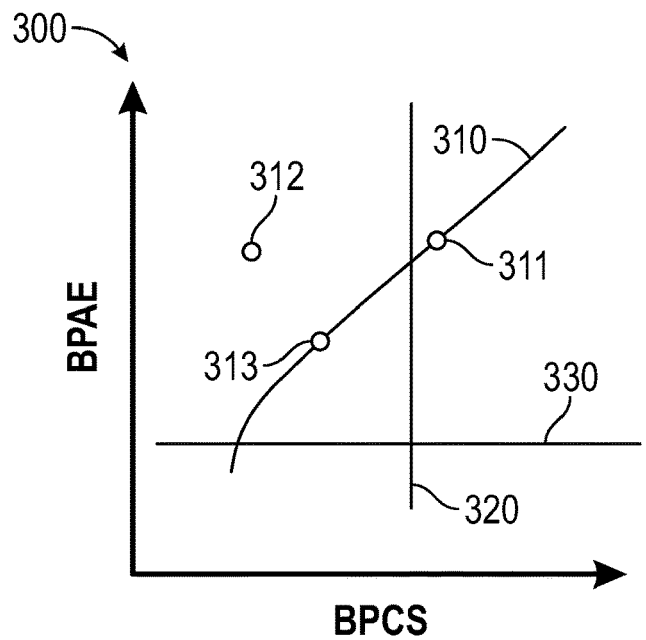
FIG. 3 is a schematic plot of a blue subpixel axial efficiency versus blue subpixel color shift performance space according to exemplary implementations of the present disclosure.

FIG. 3 is a plot schematically illustrating a performance space 300 in BPAE-BPCS$_{45}$ coordinates. The performance space 300 includes points on, or below and to the right of the performance curve 310. The performance curve 310 represents performance points achievable by varying one or more design parameters of the comparative display panels. Since comparative display panels, the display panels of the present description, and OLED displays including the display panels and hybrid color-correcting components of the present description can be illustrated on the same plot, the x- and y-axes of the plot will be referred to interchangeably as BPCS$^C_{45}$ BPAE$^C$ axes, BPCS$^0_{45}$-BPAE$^0$ axes, and BPCS$_{45}$-BPAE axes.

For a given OLED display panel, a plurality of comparative display panels can be defined which are otherwise equivalent to the OLED display panel except for one or more values of a plurality of stack design parameters. The comparative display panel define performance points in the BPCS$^C_{45}$-BPAE$^C$ space and define the performance curve 310 along the boundary of performance points. The performance curve 310 is the upper left-hand portion of the boundary of performance points. Different points along the performance curve 310 represent different performance results that can be realized by appropriate choices of the stack design parameters. If a performance point falls on the performance curve 310, there is no choice of the design parameters which results in a lower $BPCS^C_{45}$ without also lowering $BPAE^C$, or which results in a higher $BPAE^C$ without also increasing $BPCS^C_{45}$.

There is typically a largest acceptable maximum blue subpixel color shift for view angles from 0 to 45 degrees of $BPCS_{45}^{LA}$ 320 and a minimum acceptable axial efficiency $BPAE^{Min}$ 330 that may depend on the application (e.g., one or both quantities may be different for cell phones than for televisions). In some embodiments, the plurality of comparative display panels has a range of $BPCS^C_{45}$ that extends both below and above $BPCS_{45}^{LA}$. If one were to choose a performance point without reference to a hybrid color-correcting component, one would choose a point 313 along the performance curve 310 having a blue subpixel axial efficiency greater than $BPAE^{Min}$ and having a maximum blue subpixel color shift for view angles from 0 to 45 degrees less than $BPCS_{45}^{LA}$.

In some embodiments the $BPAE^{Min}$ is 2 cd/A, 4 cd/A, 6 cd/A, 8 cd/A, 10 cd/A or 12 cd/A.

According to the present description, it has been found that designing the OLED panel to consider the effects of the hybrid color-correction component can provide improved results compared to using a hybrid color-correction on a conventionally designed OLED panel. Since some could be interested in optimizing the results for the display having the hybrid color-correction component disposed on the display panel, the optimum choice for the performance point of the display panel may be below and to the right of the performance curve 310, though in some cases it may also be on the performance curve 310.

For example, in some embodiments, performance point 311 for a display panel translates to performance point 312 when a hybrid color-correction component is included and no other performance points for the display panel results in a lower blue subpixel color shift without also sacrificing another desired performance attribute such as efficiency. Note that performance point 311 is along performance curve 310.

In some embodiments, the hybrid color-correction component shifts the maximum blue subpixel color shift from 0 to 45 degrees of the display panel to the left relative to the comparative display panel such that $BPCS_{45} < BPCS^C_{45} - 0.005$.

In some embodiments, the hybrid color-correction component shifts the maximum blue subpixel color shift from 0 to 45 degrees of the display panel to the left by at least 0.005, or at least 0.01, or at least 0.015. In other words, in some embodiments, $BPCS_{45}^o - BPCS_{45} \geq 0.005$, or $BPCS_{45}^o - BPCS_{45} \geq 0.01$, or $BPCS_{45}^o - BPCS_{45} \geq 0.015$. In some embodiments, values of the design parameters of the OLED display panel are selected such that $BPCS_{45}^o$ is at least 0.015, or at least 0.020, or at least 0.025 or at least 0.030.

In some embodiments, the pixelated OLED display panel, without the hybrid color correction component disposed on the pixelated OLED display panel, has a maximum blue subpixel color shift as view angle varies from 0 to 45 degrees of $BPCS^o_{45}$, and where $BPCS^o_{45} > BPCS^{LA}_{45}$. In some embodiments $BPCS^{LA}_{45}$ is 0.02, or 0.025 or 0.03.

Once the proper values of the design parameters have been identified, an OLED display panel can be made using conventional OLED fabrication processes which may include depositing organic layers by one or more of vacuum deposition, vacuum thermal evaporation, organic vapor phase deposition, and inkjet printing. Useful methods of manufacturing OLED display panels are described in U.S. Pat. Appl. Publ. Nos. 2010/0055810 (Sung et al.), 2007/0236134 (Ho et al.), 2005/0179373 (Kim) and 2010/0193790 (Yeo et al.). In some embodiments, the optical thicknesses of various layers are used as the design parameters. The optical thickness of a layer is the physical thickness of the layer times the refractive index of the layer. In the context of a layer in an emissive stack, the refractive index used in determining the optical thickness will be taken to be the refractive index at the peak emission wavelength of the emissive stack. A complex refractive index can be defined for a layer where the imaginary part of the refractive index characterizes the absorption of the layer. Unless indicated differently, the term "refractive index" when no reference is made to a "complex refractive index" refers to a real quantity which can be taken to be the real part of a corresponding complex refractive index.

The design parameters for the OLED display panel can include any layer thickness or layer optical thickness or layer material of any one of the emissive stacks (e.g., blue subpixels), or of any combination of emissive stacks (e.g., blue and green subpixels), or for all emissive stacks. For example, a thickness or optical thickness of a cathode layer, a thickness or optical thickness of a hole transport layer, a thickness or optical thickness of a capping layer, and/or a thickness or optical thickness of an emissive layer of one or more of the emissive stacks are useful design parameters in some embodiments. In some embodiments, the thicknesses of the hole transport layer and emissive layers for the different colored subpixels are considered to be separate design parameters but each of the thicknesses of the other layers of the OLED emissive stacks is taken to be a design parameter common to each of the emissive stacks since common layers are used for the emissive stacks is many conventional manufacturing processes due to manufacturing cost constraints.

Figure 4:
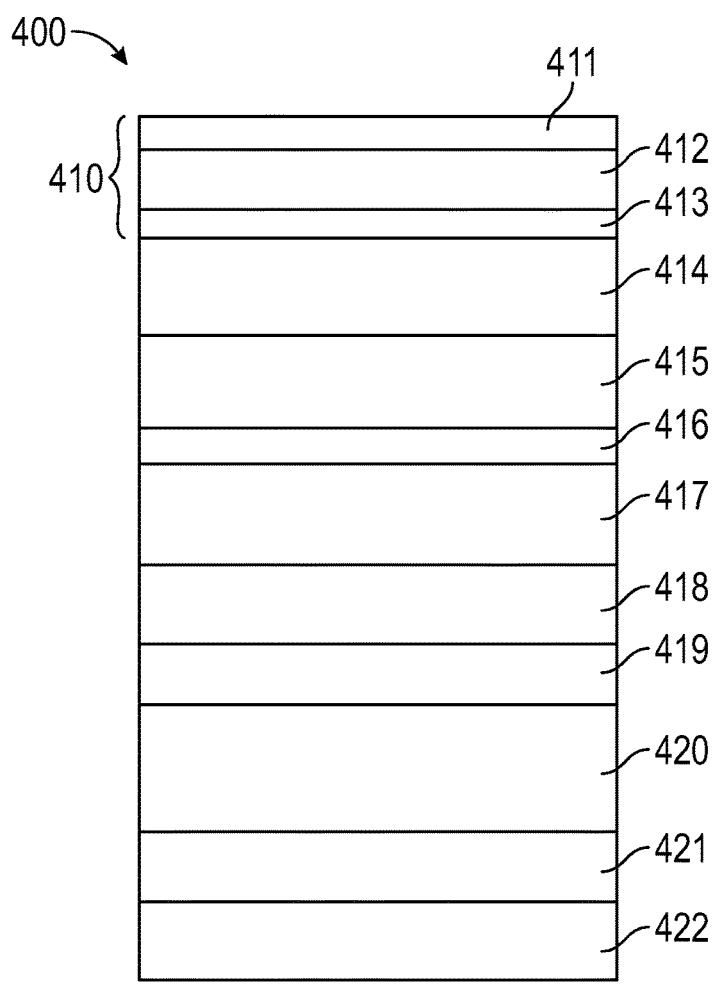
FIG. 4 is a schematic cross-sectional view of an OLED emissive stack according to exemplary implementations of the present disclosure.

FIG. 4 is a schematic cross-sectional view of TE-OLED emissive stack 400. The TE-OLED emissive stack 400 includes, in sequence from the top (light emitting side), encapsulant layers 410, optional buffer layer 414, capping layer 415, cathode 416, electron transport layer 417, emissive layer 418, electron blocking layer 419, hole transport layer 420, hole injection layer 421 and anode 422. The encapsulant layers 410, which may be a thin film encapsulant (TFE), include an organic layer 412 disposed between first and second inorganic layers 411 and 413. The organic layer 412 may have a thickness on the order of micrometers (e.g., about 6 micrometers) and the first and second inorganic layers 411 and 413 may be $Al_2O_3$ layers or silicon nitride layers or other inorganic materials known in the art, for example, having a thickness of about 50 nm to about 2000 nm, for example. The optional buffer layer 414 may be a LiF layer and may have a thickness in the range of 80-500 nm, for example. The capping layer 415 may be a TCTA (Tris(4-carbazoyl-9-ylphenyl)amine) layer and may have a thickness in the range of 30-85 nm, for example. The cathode 416 may be a magnesium-silver alloy (e.g., having an Mg:Ag atomic ratio of 9:1) and may have a thickness in a range of 6-16 nm, for example. The electron transport layer 417 may be a Bphen (4,7-diphenyl-1,10-phenanthroline) layer and may have a thickness in the range of 30-65 nm, for example. The emissive layer 418 may include TPBi (2,2', 2"-(1,3,5-Benzinetriyl)-tris(1-phenyl-1-H-benzimidazole) available from Sigma-Aldrich (St. Louis, Mo.) with a dopant (e.g., at 10 wt. %) and may have a thickness in a range of 15-35 nm, for example. Suitable dopants include Firpic (Bis[2-(4,6-difluorophenyl)pyridinato-C2,N](picolinato) iridium(III)) (blue), Irppy3 (Tris[2-phenylpyridinato-C2,N] iridium(III))(green), and PQIr ((2,4-Pentanedionato)bis[2-(2-quinolinyl)phenyl]iridium(III)) (red). The electron blocking layer 419 may be a 2TNATA (4,4',4"-Tris[2-naphthyl(phenyl)amino]triphenylamine) (available from Sigma-Aldrich) layer and may have a thickness in the range of 8-12 nm, for example. The hole transport layer 420 may be a TCTA (Tris(4-carbazoyl-9-ylphenyl)amine) (available from Sigma-Aldrich) layer and may have a thickness in the range of 90 nm to 230 nm, for example, with thinner layers used for blue subpixels, thicker layers used for red subpixels and intermediate thicknesses used for green subpixels. The hole injection layer 421 may be an indium tin oxide (ITO) layer and may have a thickness in the range of 5-18 nm, for example. The anode 682 may be an aluminum layer and may have a thickness of 100 nm, for example.

Figure 5:
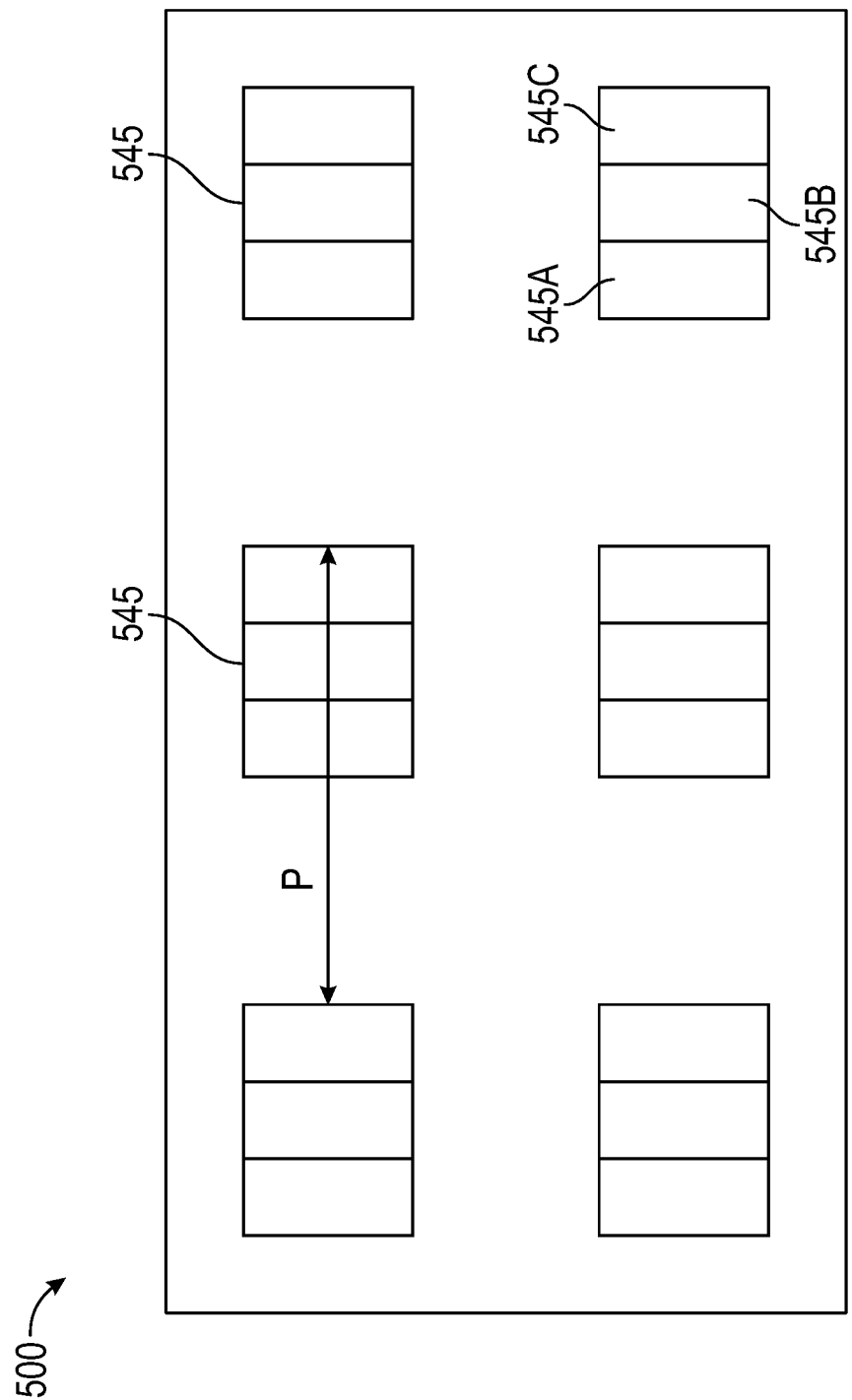
FIG. 5 is a schematic top view of an OLED display panel according to exemplary implementations of the present disclosure.

FIG. 5 is a schematic top view of an OLED display panel 500 which includes a plurality of pixels 545, where each pixel includes subpixels 545a, 545b and 545c. Subpixels 545a, 545b, and 545c are typically different colors such as red, green and blue. An average pixel spacing P is illustrated. The spacing P is the pitch between nearest neighbor pixels. Display panel 500 may be a display panel of the present description or may be a comparative display panel depending on the layers used for the subpixels 545a, 545b, and 545c. Additional subpixels (e.g., yellow) may be included in some embodiments. The pixel and subpixel arrangement can be similar to or different from that schematically illustrated in FIG. 5. For example, a triangular pattern, striped pattern, diagonal pattern, or a PENTILE matrix can be used as is known in the art. In the case of a PENTILE matrix which includes red and green pairs of subpixels and green and blue pairs of subpixels, for example, each pixel can be understood to include a red and green pair and a green and blue pair, so that each pixel includes four subpixels.

Figure 6C:
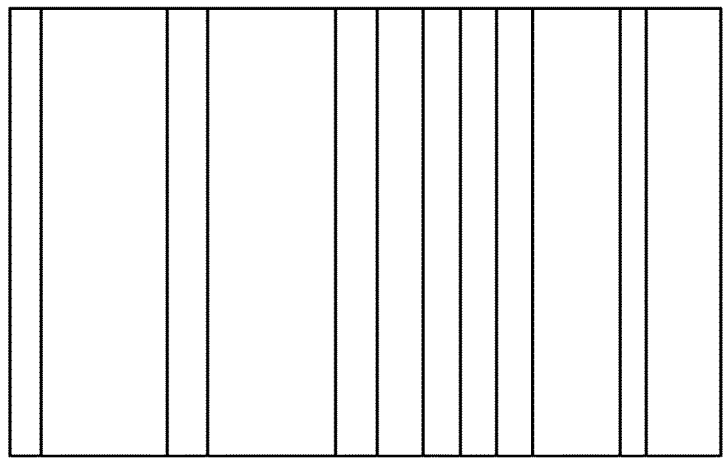
FIGS. 6A-6C are schematic cross-sectional views of red, green and blue OLED emissive stacks, respectively according to exemplary implementations of the present disclosure.
Figure 6B:
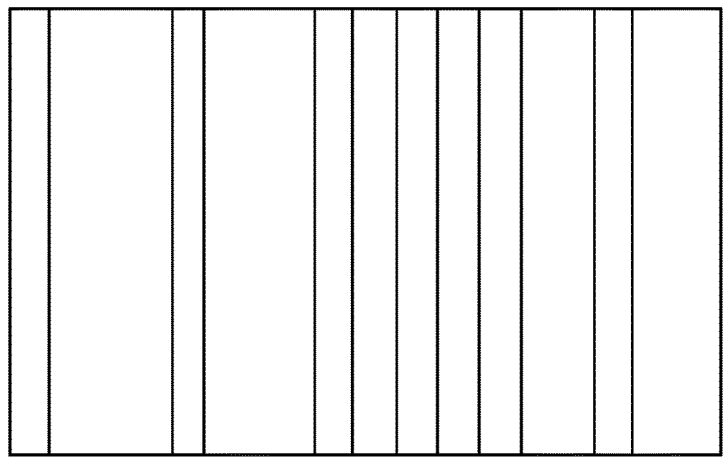
Figure 6A:
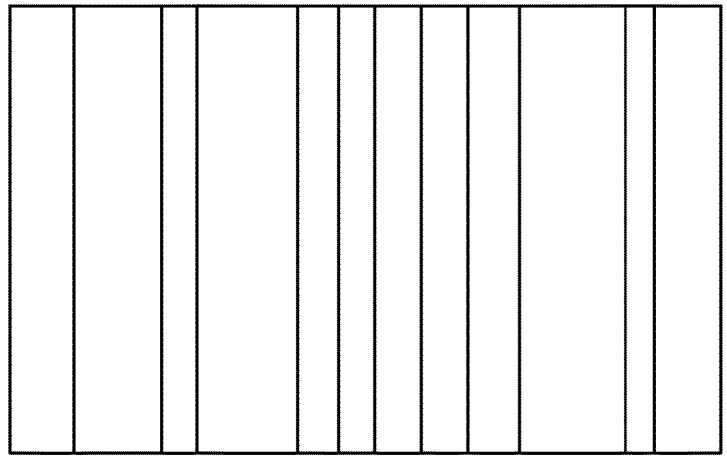

FIG. 6A-C are schematic cross-sectional views of a red OLED emissive stack 675r, a green OLED emissive stack 675g, and a blue OLED emissive stack 675b, respectively. Each emissive stack 675r, 675g, and 675b correspond to the emissive stack 400 and have the same types of layers described for the emissive stack 400. The materials used in one or more layers of one emissive stack may be different from those used in another emissive stack. For example, the emissive layer 418 used in different colored emissive stacks typically have differing compositions to provide the different colors. The layer thicknesses of one or more layers of one emissive stack may be different from those of another emissive stack. The emissive stacks 675r, 675g and 675b may also correspond to subpixels 545a, 545b and 545c.

Figure 7:
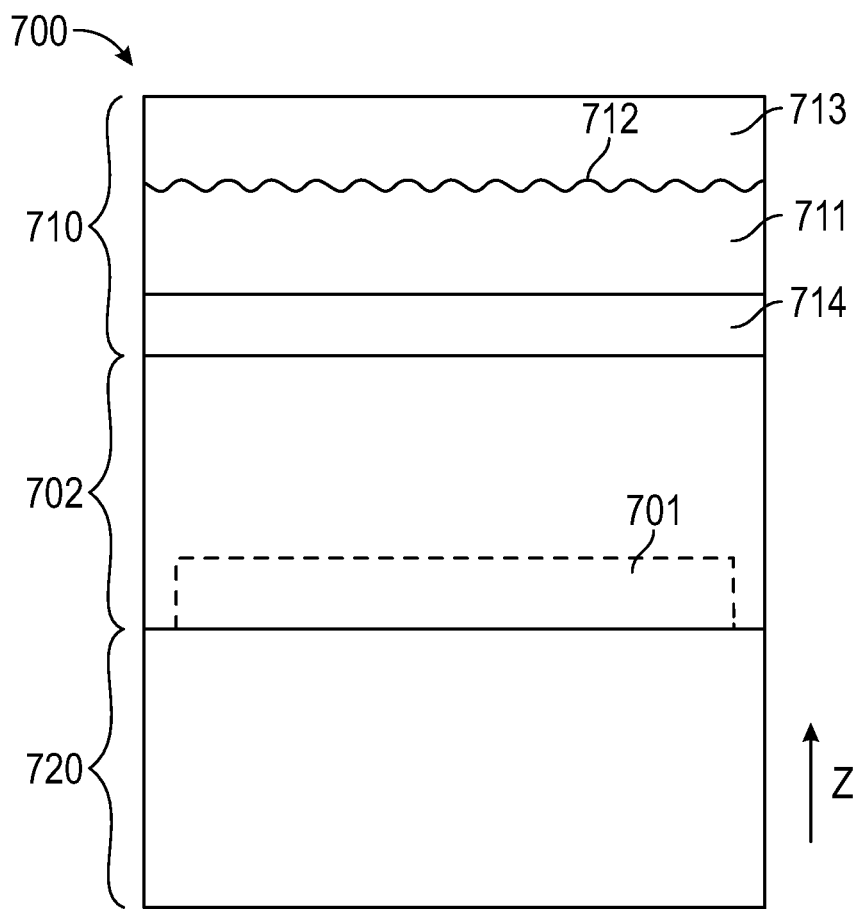
FIG. 7 is a cross-sectional view of an OLED display according to exemplary implementations of the present disclosure.

FIG. 7 is a cross-sectional view of an organic light emitting diode (OLED) display 700 including a hybrid color-correction component 710 disposed proximate to and outside of an evanescent zone 701 of an emissive OLED stack 720. The evanescent zone 701 typically extends only a few wavelengths of visible light from the emissive OLED stack 720 in the z-direction. The OLED stack 720 may include many layers as illustrated in FIG. 4. An inner layer 702 separates the hybrid color-correction component 710 from the emissive OLED stack 720. Inner layer 702 may include an encapsulant for the emissive OLED stack 720 (e.g., corresponding to encapsulant layers 410), or may include a touch sensor. The hybrid color-correction component 710 includes a color correcting nanostructured interface 712 and an ATL 714. The nanostructured interface 712 is disposed between first and second layers 711 and 713. The ATL 714 is disposed between the first layer 711 and the OLED stack 720.

Figure 8:
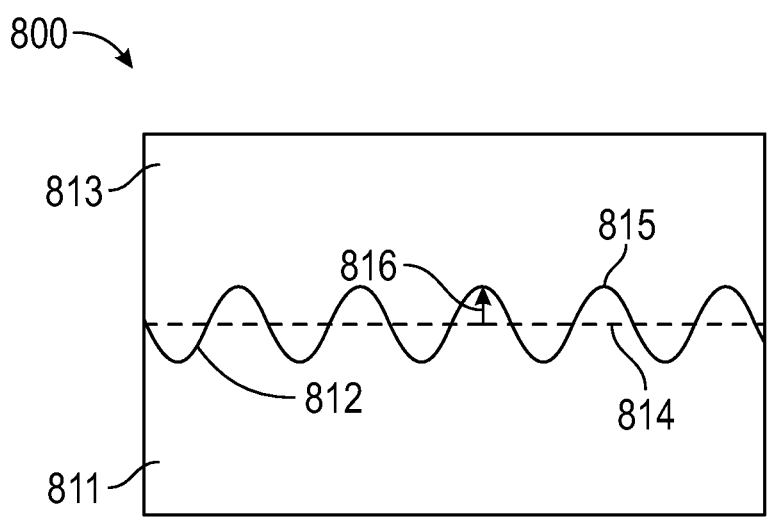
FIG. 8 is an illustration of a nanostructured interface according to exemplary implementations of the present disclosure.

In some embodiments the ATL includes an angular transformation nanostructured interface. In some embodiments the angular transformation nanostructured interface may be the same or different design from the color correction nanostructured interface. In some embodiments the ATL includes a plurality of angular transformation nanostructured interfaces. FIG. 8 is a generalized schematic 800 of a nanostructured interface 812 located at the interface between a first layer 811 and a second layer 813. A nanostructured interface 812 has a displacement 816, which will be denoted h(x,y), from a mean plane 814. A nanostructured interface 812 has a plurality of peaks 815 and an average spacing S between nearest neighbor peaks. As used herein, averages refer to unweighted arithmetic averages unless specified differently. The variance of the displacement 816 from the mean plane 814 of the nanostructured interface 812 is useful to describe the performance of the nanostructured interface.

In some embodiments, the first and second layers 811 and 813 are polymeric layers having a continuous polymeric phase. Either of the first and second layers 811 and 813 may include inorganic nanoparticles in order to modify the refractive index. Such nanoparticles typically have an average size less than 100 nm (the average size can be determined from the average volume V of the nanoparticles (unweighted arithmetic average) as $(6\ V/\pi)^{1/3}$). In some embodiments, a tool having a desired nanostructured surface is used to form the second layer 813 in a continuous cast and cure process as described further elsewhere herein. The first layer 811 can be formed by backfilling a nanostructured surface of the second layer 813 with a crosslinkable composition, for example. The backfill material can be applied to form the first layer 811 using, for example, one of the following methods: liquid coating; vapor coating; powder coating; lamination; dip-coating; or roll-to-roll coating, this list is not meant to be limiting. In some embodiments, the backfill material forms a planar surface opposite the nanostructured interface. Each of the first and second layers 811 and 813 may be continuous layers (e.g., a layer with a continuous polymeric phase). Each of the first and second layers 811 and 813 may be solid layers (e.g., hard or soft polymeric layers, or inorganic layers).

The second layer 813 may be a crosslinked resin layer and may have a refractive index in the range of 1.2 to 1.6, or in the range of 1.4 to 1.55, for example. The refractive index refers to the refractive index measured at 632 nm, unless specified differently or unless the context clearly indicates differently. In some embodiments, the first layer 811 has a refractive index of at least 1.4, or at least 1.5, or at least 1.6, or at least 1.7, or at least 1.75. In some embodiments, the first layer 811 has a refractive index of no more than 2.2, or no more than 2.1, or no more than 2.0. In some embodiments, the first layer 811 has a refractive index larger than that of the second layer 813. The first and second layers 811 and 813 provide a refractive index contrast (absolute value of the difference in the refractive index of the second layer 813 and the refractive index of the first layer 811) across a nanostructured interface 812. In some embodiments, the refractive index contrast is constant along a nanostructured interface 812. In some embodiments, the refractive index contrast is in a range of 0.1, or 0.2, or 0.3 to 1.0. In some embodiments, the second layer 813 is an ultralow refractive index material, such as those described in U.S. Pat. App. Pub. No. 2012/0038990 (Hao et al.), and has a refractive index in a range of 1.2 to 1.35 and the first layer 811 is a high index layer having a refractive index greater than 1.6 or greater than 1.7.

Typically, it is desired to have a large refractive index contrast, since diffracted power transmitted through the nanostructured interface is proportional to the square of the refractive index contrast, and this can be achieved by utilizing a high refractive index material for the first layer 811. Examples of suitable materials for the first layer 811 include the following: high index inorganic materials; high index organic materials; a nanoparticle filled polymer material; silicon nitride; polymers filled with high index inorganic materials; and high index conjugated polymers. Examples of high index polymers and monomers are described in C. Yang, et al., Chem. Mater. 7, 1276 (1995), and R. Burzynski, et al., Polymer 31, 627 (1990) and U.S. Pat. No. 6,005,137, all of which are incorporated herein by reference to the extent that they do not contradict the present description. Examples of polymers filled with high index inorganic materials are described in U.S. Pat. No. 6,329,058. Examples of nanoparticles for the nanoparticle filled polymer material include the following high index materials: $TiO_2$, $ZrO_2$, $H_fO_2$, or other inorganic materials.

In some embodiments, a nanostructured interface 812 has a substantially azimuthally symmetric power spectral density (PSD). The PSD is given by taking the magnitude squared of the two-dimensional Fourier transform of the displacement h(x,y), also denoted h($\vec{x}$), where $\vec{x}$=(x, y) is a vector in the x-y plane, over an area of the x-y plane and dividing by the area for an area sufficiently large compared to an average spacing between peaks in h(x,y) so that the ratio of the magnitude squared of the Fourier transform to the area is approximately independent of the area. The PSD at a wavevector, $\vec{k}$ (also denoted k), can be expressed as $$PSD(\vec{k}) = \frac{1}{A}\left|\int_A d^2x e^{-i\vec{k}\cdot\vec{x}} h(\vec{x})\right|^2$$

for sufficiently large area, A. Typically, the average spacing is less than 1 micrometer and a square area 10 micrometers by 10 micrometers is a sufficiently large area for determining the PSD. PSDs have units of length to the fourth power. It follows from the definition of the PSD that the two-dimensional Fourier space integral of the PSD is equal to $(2\pi)^2$ times the variance of the displacement from the mean displacement of the nanostructured interface. It has been found that utilizing the substantially azimuthally symmetric power spectral densities described herein are useful for providing a desired color correction or angular transformation without significantly altering on-axis output (e.g., brightness, color and contrast) of the OLED display when the PSD is suitably chosen. Nanostructured interfaces having the power spectral densities described elsewhere herein can be made using a tool having a nanostructured surface. In some embodiments, the tool includes a plurality of particles partially embedded in a substrate. Useful techniques for making the tool are described in U.S. Pat. Appl. No. 2014/0193612 (Yu et al.) and U.S. Pat. No. 8,460,568 (David et al.). The nanostructured surface of the tool can be characterized by atomic force microscopy (AFM) and this can be used to determine the PSD of the surface via fast Fourier transform, for example.

Further details on useful nanostructured interfaces and methods of making the nanostructured interfaces can be found in described in U.S. Prov. Appl. Nos. 62/342,620 (Freier et al.) and 62/414,127 (Erickson et al.), and in PCT Publication No. WO 2017/205174 (Freier et al.).

In some embodiments, the ATL is or includes a volumetric diffuser film. It has been found that certain diffuser films when placed proximate an OLED display panel reduce the color shift of the OLED display panel. In some embodiments, the diffuser film is a polymeric film including a polymeric layer including interconnected pores and channels. In some embodiments, the diffuser film is a polymeric film including a polymeric layer that is void free and that includes particles uniformly dispersed in a polymeric matrix.

The term "haze" refers to wide angle light scattering, where light emitting from a display is diffused in all directions causing a loss of contrast. More particularly, the term "bulk haze" refers to the wide-angle light scatter measured with a broad sampling beam of several millimeters (mm) so as to give an average result from said several-millimeter aperture of the polymeric film. Also, more particularly, the term "micro-haze" refers to wide angle light scattering as measured by a smaller illuminated area of tens of microns (i.e., less than 100 microns, e.g., 10 to 40 microns) such that the average micro-haze measurement represents the average result from many measurements, each tens of microns in area, extending over several millimeters of the polymeric film.

The term "normalized micro-haze non-uniformity" refers to the ratio of the standard deviation of the micro-haze to the average value of micro-haze when measured over at least 1 mm, and typically over several millimeters. The standard deviation of micro-haze is a measure of micro-haze noise. As such, normalized micro-haze non-uniformity is a metric for the ratio of visual micro-haze noise to micro-haze signal.

The term "clarity" refers to narrow angle scattering, where light is diffused in a small angle range with high concentration. The effect of having a certain clarity basically describes how well very small details can be seen through a specimen.

Haze, clarity and visible light transmission can be determined as described in the ASTM D1003-13 test standard.

In some embodiments the ATL is or includes a polymeric film with the following characteristics: a clarity of at least 70% (preferably at least 80 percent, or preferably at least 85%, or more preferably at least 90%); a visible light transmission of at least 85% (preferably at least 90%); a bulk haze of 15% to 80% (preferably 20% to 80%, more preferably 30% to 70%, and even more preferably 30% to 50%). In certain embodiments, a polymeric film of the present description has a normalized micro-haze non-uniformity of not more than 12% (preferably less than 10%, or more preferably less than 8%) across the polymeric film. Such films can function as optical diffusers with controlled local uniformity when used in as an ATL. The clarity, transmission, and bulk haze can be measured using a Haze Gard Plus (from BYK Gardner, Columbia, Md.), which reports measurements from a sampling beam of 18 millimeters (mm) aperture of the polymeric film. The preferred clarity, transmission and haze ranges may differ for the displays of the present description from the corresponding preferred ranges when used in conventional displays due to the differing design space for display panels used in the present description.

Figure 9:
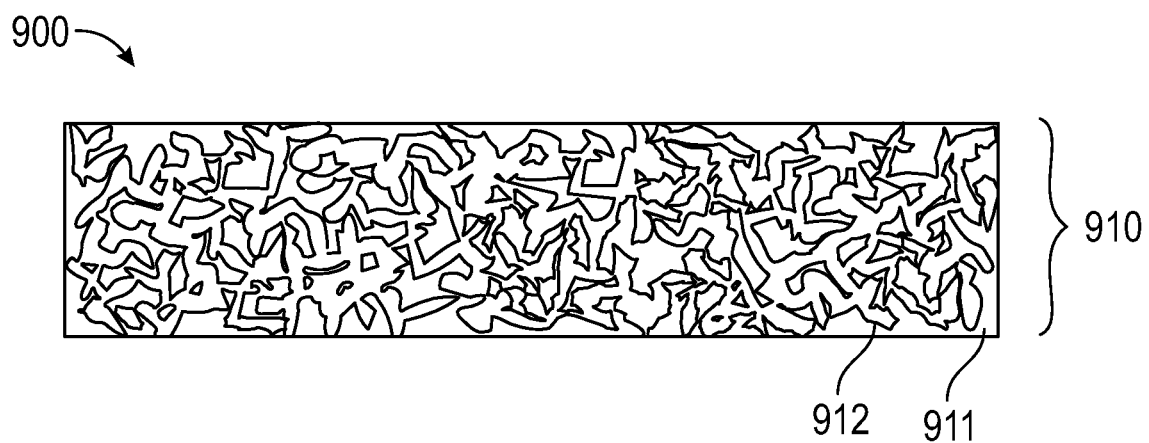
FIG. 9 is an illustration of a polymeric film according to exemplary implementations of the present disclosure.

As seen in FIG. 9, in some embodiments, the ATL 900 is or includes a polymeric film where the polymeric film includes a first polymeric layer 910 having two major surfaces. In some embodiments, the first polymeric layer 910 includes a first polymer region 911 including a first material having a refractive index of $n_1$; and a second region 912 including a network of interconnected pores and channels within the first polymer region 911, the channels including a second material having a refractive index of $n_2$. In some embodiments, the first material includes a first elastic polymeric material and optional particles. In some embodiments, the second material includes a second polymeric material and optional particles; and/or air.

Typically, the plurality of interconnected pores and channels includes pores connected to one another via hollow tunnels or tunnel-like passages. In certain embodiments, in a network there can be multiple pluralities of interconnected pores and channels. In certain embodiments, there can be minor amounts of closed or unconnected pores.

Typically, the pores and channels have an average cross-section (e.g., diameter for spherical pores) of no greater than 2 micrometers. Alternatively stated, the network of interconnected pores and channels possess angular-averaged scattering properties that are similar to a scattering particle of less than 2 micrometers in size.

The first material (of the first polymer region) has a refractive index of $n_1$. The second material (of the second interconnected region) has a refractive index of $n_2$. The materials of these regions are selected such that $n_1$ is different than $n_2$. In certain embodiments, $|n_1-n_2|$ is at least 0.01. In certain embodiments, $|n_1-n_2|$ is at least 0.02, or at least 0.03, or at least 0.04, or at least 0.05, or at least 0.1. In certain embodiments, $|n_1-n_2|$ $n_1$ is at most 0.5. In certain embodiments, $n_1$ is within 0.5 of $n_2$, $n_1$ is within 0.4 of $n_2$, $n_1$ is within 0.3 of $n_2$, $n_1$ is within 0.2 of $n_2$, or $n_1$ is within 0.1 of $n_2$. In this context, "within" means within 0.5 (or 0.4, or 0.3, or 0.2, or 0.1) higher or lower. See, for example, Intl. Pub. No. WO 2018/204675 (Hao et al.), herein incorporated by reference.

Figure 10:
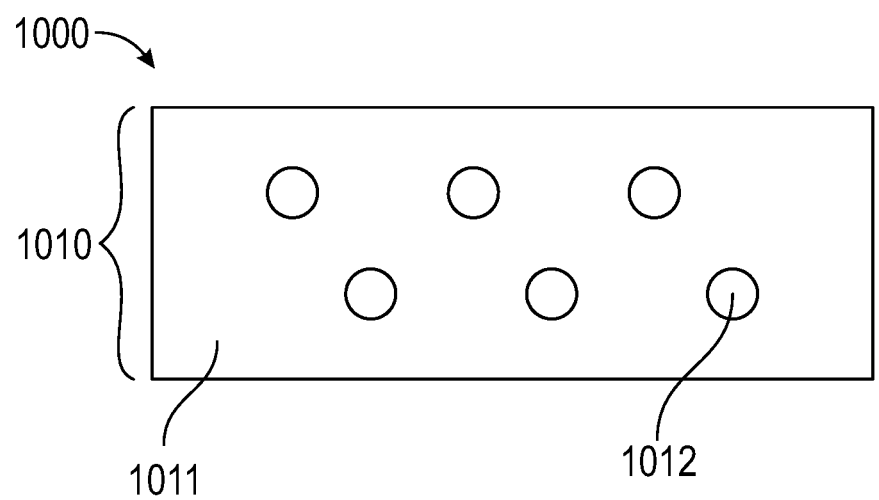
FIG. 10 is an illustration of a polymeric film according to exemplary implementations of the present disclosure.

As seen in FIG. 10, in some embodiments, the ATL is or includes a polymeric film 1000 including a polymeric layer 1010 having two major surfaces, where the polymeric layer 1010 includes a polymeric matrix and particles (preferably, polymeric particles) and is preferably void free. The first polymeric layer 1010 includes: a first polymeric matrix 1011 having a refractive index $n_1$; and particles 1012 having a refractive index $n_2$ uniformly dispersed within the first polymeric matrix 1011; where the particles are present in an amount of less than 30 vol-%, based on the volume of the first polymeric layer, and have a particle size range of 400 nanometers (nm) to 3000 nm; and where $n_1$ is different than $n_2$. Such a polymeric film has the optical function optical diffuser.

In certain embodiments, the polymeric materials are adhesive materials. In certain embodiments, at least one adhesive material includes an optically clear adhesive (OCA). In certain embodiments, the optically clear adhesive is selected from an acrylate, a polyurethane, a polyolefin (such as a polyisobutylene (PIB)), a silicone, or a combination thereof. Illustrative OCAs include those described in International Pub. No. WO 2008/128073 (3M Innovative Property Co.) relating to antistatic optically clear pressure sensitive adhesives and WO 2009/089137 (Sherman et al.) relating to stretch releasing OCA, U.S. Pat. App. Pub. Nos. US 2009/0087629 (Everaerts et al.) relating to indium tin oxide compatible OCA, US 2010/0028564 (Cheng et al.) relating to antistatic optical constructions having optically transmissive adhesive, US 2010/0040842 (Everaerts et al.) relating to adhesives compatible with corrosion sensitive layers, US 2011/0126968 (Dolezal et al.) relating to optically clear stretch release adhesive tape, and U.S. Pat. No. 8,557,378 (Yamanaka et al.) relating to stretch release adhesive tapes. Suitable OCAs include acrylic optically clear pressure sensitive adhesives such as, for example, 3M OCA 8146 available from 3M Company, St. Paul, Minn.

The particles have a particle size range of 400 nanometers (nm) to 3000 nm, or a particle size range of 700 nm to 2.0 micrometers (micrometers). In this context, "particle size" refers to the longest dimension of a particle, which is the diameter of a spherical particle. A "particle size range" refers to a distribution of particle sizes from the smallest to the largest (not an average). Thus, the particles are not necessarily uniform in size. The particle size can be determined by scanning electron microscopy (SEM).

The particles may be of a variety of shapes, including polyhedron, parallelepiped, diamond, cylinder, arcuate, arcuate cylinder, rounded (e.g., oval or spherical or equi-axial), hemisphere, gumdrop, bell, cone, frusto-conical cone, irregular, and mixtures thereof. In certain embodiments, the particles are spherical beads.

The polymeric film of the present description may include a first polymeric layer having two major surfaces, where the first polymeric layer includes a first polymeric matrix and particles (preferably, polymeric particles) uniformly dispersed therein. The particles have a refractive index $n_2$ and the first polymeric matrix in which the particles are dispersed have a refractive index $n_1$, where $n_1$ is different than $n_2$. In certain embodiments, $|n_1-n_2|$ is at least 0.01. In certain embodiments, $|n_1-n_2|$ is at least 0.02, or at least 0.03, or at least 0.04, or at least 0.05. In certain embodiments, $|n_1-n_2|$ is at most 0.5. In certain embodiments, $n_1$ is within 0.5 of $n_2$, $n_1$ is within 0.4 of $n_2$, $n_1$ is within 0.3 of $n_2$, $n_1$ is within 0.2 of $n_2$, or $n_1$ is within 0.1 of $n_2$. In this context "within" means within 0.5 (or 0.4, or 0.3, or 0.2, or 0.1) higher or lower.

Particles are preferably organic polymeric particles, but other particles may be used as well. Exemplary non-organic particles include $SiO_2$, $Al_2O_3$, $ZrO_2$, ZnO, and mixtures thereof. Exemplary organic polymers for use in the organic particles include an organic polymeric material selected from a silicone, such as a polydimethylsiloxane (PDMS), a polyurethane, a polymethyl methacrylate (PMMA), a polystyrene, or a combination thereof.

In certain embodiments, the particles are present in the first polymeric layer in an amount of less than 30 percent by volume (vol-%), based on the volume of the first polymeric layer. In certain embodiments, the particles are present in the first polymeric matrix in an amount of up to 25 vol-%, up to 20 vol-%, or up to 15 vol-%, based on the total volume of the first polymeric layer. In certain embodiments, the particles are present in the first polymeric matrix in an amount of at least 0.5 vol-% (or at least 1 vol-%), based on the total volume of the first polymeric layer.

Further details on polymeric films useful as ATL components are described in International Pub. Nos. WO 2018/204648 (Hao et al.) and WO 2018/204675 (Hao et al.), for example.

In some embodiments the ATL is or includes a surface diffuser. A surface diffuser often includes a microstructured interface where the microstructured features have one dimension in a range of about 1 micrometer to about 1000 micrometers; e.g. length, width, height, mean displacement, or spacing between features.

Figure 11:
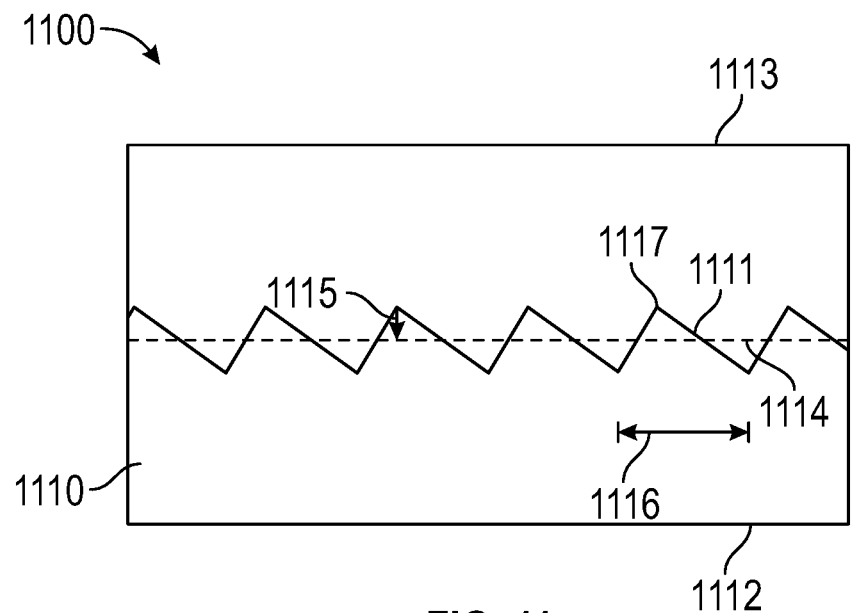
FIG. 11 is an illustration of a polymeric film according to exemplary implementations of the present disclosure.

FIG. 11 is a diagram of an ATL 1100 that includes a microstructured surface 1111 between a first flat major surface 1112 and a second flat major surface 1113. The microstructured interface 1111 has a displacement 1115, from a mean plane 1114. A microstructured interface 1111 has a plurality of peaks 1117 and an average spacing 1116 between nearest neighbor peaks. Factors affecting angular transformation of light at microstructured surface 1111 may include, for example, a refractive index of optical film 1110, a refractive index of media contacting microstructured surface 1111, and an angle of incident light on microstructured surface 1111.

In some embodiments, as exemplarily described in Intl. Pub. Nos. WO 2018/130926 and WO 2018/130926 (Derks et al.), the ATL includes an optical film having a microstructured surface. The microstructured surface includes an irregular distribution of a plurality of prismatic structures that include a plurality of facets angled from a reference plane of the microstructured surface. While the prismatic structures may be individually irregular or random, the facets of the prismatic structures may be sized, angled, and distributed such that the surface azimuthal distribution of facets may be substantially uniform along the reference plane, while the surface polar distribution of facets may fall substantially within a polar range that correlates with a peak transmission of light normally incident to the reference plane. This distribution of facets may result in optical distribution properties of the microstructured surface that approximate conical optical distribution properties, such as the optical distribution properties of an ensemble of conical prismatic structures having an equivalent distribution of base angles, while covering substantially the entire major surface with prismatic structures. The use of interconnected facet surfaces may enable substantially the entire surface of the optical film to be covered by the microstructured surface.

In other embodiments the ATL is a surface diffuser which includes particles protruding from a major surface.

In some embodiments, the ATL is or includes a wavelength and polarization dependent partial reflector. In some embodiments, the partial reflector includes an optical stack which includes a plurality of optical repeat units which provide a desired wavelength and polarization dependent reflectivity and transmissivity.

The partial reflectors may be referred to as reflective polarizers or as partial reflective polarizers since the partial reflectors, in some embodiments, have a reflection band for one polarization state and not for an orthogonal polarization state. The reflection band typically has an average reflectance for normally incident light polarized along a block axis less than 97%, or less than 95%, or less than 90%, or less than 75%, or less than 60%. The reflection band may be weaker than the reflection band of conventional multilayer optical film mirrors or reflective polarizers which typically provide an average reflectance of greater than 98%. The partial reflectors may be birefringent multilayer optical films with controlled band edges and tailored reflectivity with incidence angle. In some embodiments, the partial reflectors are designed to have minimal visual effects on axis when incorporated in a display but create optical gain for desired wavelengths off axis. It has been found that utilizing the partial reflectors of the present description as an ATL in a hybrid color correction component can suitably tune the intensity distribution for a given angular distribution of light propagating in the ATL.

Figure 12:
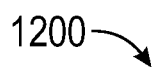
FIG. 12 is an illustration of a polymeric film according to exemplary implementations of the present disclosure.

A wavelength and polarization dependent partial reflector or reflective polarizer of the present description is typically a multilayer optical film that includes an optical stack including a plurality of optical repeat units where each optical repeat unit includes first and second layers which may be polymeric layers. FIG. 12 is a schematic perspective view of an exemplary optical repeat unit (ORU) of a multilayer optical film 1200. FIG. 12 depicts only two layers of the multilayer optical film 1200, which can include tens or hundreds of such layers arranged in one or more contiguous packets or stacks. The film 1200 includes individual microlayers 1202, 1204, where "microlayers" refer to layers that are sufficiently thin so that light reflected at a plurality of interfaces between such layers undergoes constructive or destructive interference to give the multilayer optical film the desired reflective or transmissive properties. The microlayers 1202, 1204 can together represent one optical repeat unit (ORU) of the multilayer stack, an ORU being the smallest set of layers that recur in a repeating pattern throughout the thickness of the stack. The microlayers have different refractive index characteristics so that some light is reflected at interfaces between adjacent microlayers. For optical films designed to reflect light at ultraviolet, visible, or near-infrared wavelengths, each microlayer typically has an optical thickness (i.e., a physical thickness multiplied by the relevant refractive index) of less than about 1 micrometer. Thicker layers can, however, also be included, such as skin layers at the outer surfaces of the film, or protective boundary layers (PBL) disposed within the film that separate packets of microlayers, as desired. In some embodiments, only a single packet or stack of microlayers is included in the optical films of the present description.

Exemplary multilayer optical films are composed of polymer materials and may be fabricated using coextruding, casting, and orienting processes. Reference is made to U.S. Pat. No. 5,882,774 (Jonza et al.) "Optical Film", U.S. Pat. No. 6,179,948 (Merrill et al.) "Optical Film and Process for Manufacture Thereof", U.S. Pat. No. 6,783,349 (Neavin et al.) "Apparatus for Making Multilayer Optical Films", and patent application publication US 2011/0272849 (Neavin et al.) "Feedblock for Manufacturing Multilayer Polymeric Films".

In some embodiments the ATL consists of at least a first low index layer, the first layer having first and second surfaces, the first surface being disposed between the OLED stack and the second surface. The low index layer has an index of refraction, $n_1$, which causes light propagating at a range of internal angles to be totally internally reflected at the first surface. The low index layer may have an index of refraction less than, $n_1 < 1.40$ at a wavelength of 532 nm. In some embodiments $n_1$ is between 1.20 and 1.40 at a wavelength of 532 nm. In some embodiments $n_1$ is between 1.35 and 1.40 at a wavelength of 532 nm.

EXAMPLES

The Examples are generally presented as illustrations of the advantages of matched OLED devices and color correction components. The testing results generally focus on performance metrics of brightness and color shift over a range of viewing angles. The fabricated test coupons which are used for example optical measurements are not necessarily the same as final display devices for commercial use. The particular examples herein should not be seen as limiting.

Test Methods

Some OLED measurement methods include luminance-current-voltage (LIV) and electroluminescent spectral measurements. These measurements may utilize a PR655 spectroradiometer (Photo Research, Inc. Chatsworth Calif.) and a Keithley 2400 Sourcemeter (Keithley Instruments Inc. Cleveland Ohio). The below optical measurements were taken as a function of angle by rotating the OLED device, with or without color correcting components, relative to the PR655 camera.

Each OLED device was tested without a color correction component as a control. Subsequently, a color correcting component was laminated to the OLED and again evaluated for brightness and color properties.

Transmission, haze and clarity measurements for the diffusive adhesive type color correcting component were made using a Hazegard (BYK-Chemie GmbH, Wesel Germany, according to ASTM D1003-13).

OLED Sample Preparation

Blue OLED test coupons were built using standard vacuum thermal evaporation for organic and metal layers at a base pressure of about $10^{-7}$ Torr. Vacuum sputtering was used for the oxide layers at a base pressure of about $10^{-3}$ Torr. A series of encapsulation layers consisting of a sputtered $Al_2O_3$ layer (50 nm), an organic smoothing layer (E-200, EM Index) deposited via evaporation (2.5 μm) and a second $Al_2O_3$ (50 nm) layer were deposited on top of the OLED capping layer.

Preparation of Diffusive Adhesive Type Color Correcting Component

Some preparation methods for a diffuse adhesive type of color correcting component are described in U.S. Pat. No. 9,960,389 (Hao et al.). The base adhesive solution was prepared as follows. A monomer premix was prepared by adding EHA (55 parts), iBOA (25 parts), HEA (20 parts), and 0.02 part of D-1173. The mixture was partially polymerized under a nitrogen (inert) atmosphere by exposure to ultraviolet radiation generated by an ultraviolet light emitting diode (UVA-LED) to provide a coatable syrup having a viscosity of about 1000 centipoise (cps). Then HDDA (0.15 part), IRGACURE 651 (0.15 part), and KBM-403 (0.05 part) were added to the syrup to form a homogenous adhesive coating solution.

For these examples, the diffuse adhesive included 2 μm diameter silicone beads (TOSPEARL 120A, refractive index of 1.42 available from Momentive Performance Materials, Waterford, N.Y.) loaded into the base acrylic adhesive matrix with refractive index of 1.48. The beads were first added to adhesive solution and then mechanically stirred using an overhead Jiffy LM Pint mixer (manufactured by Jiffy Mixer Co. Inc, Corona, Calif.) for 2 hours. After mechanical stirring, the admixture was placed on a mixing roller for an additional 24 hours.

Preparation of Nanostructure Type Color Correcting Component

The nanostructured film type color-correction component was generally described in PCT Publication No. WO 2017/205174 (Freier et al.). For these examples, a nanostructured film was laminated to the OLED device using an index matching gel (n=1.46). This nanostructured film utilized nanostructures between low and high index layers having a root-mean-square amplitude (also denoted Var) of 125 nm and having a substantially azimuthally symmetric power spectral density (PSD) concentrated in an annulus between wavenumbers 25 rad/μm$^{-1}$ and 37 rad/μm$^{-1}$. After baseline measurements of the bare OLED device, the high index (e.g., n=1.85) nanostructured layer was laminated to the OLED stack for second measurements.

Descriptions of Example OLEDs

Figure 13:
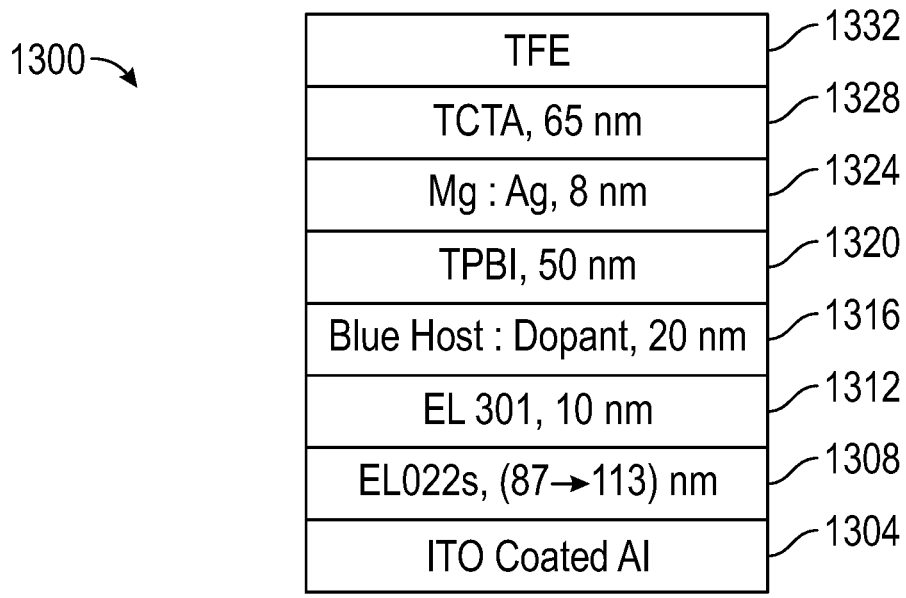
FIG. 13 is a cross-sectional view of an exemplary blue OLED subpixel according to exemplary implementations of the present disclosure.

FIG. 13 is a cross-sectional view of a blue OLED subpixel 1300. The anode 1304 is formed from indium-tin-oxide (ITO) deposited on a 100-nm-thick layer of Aluminum (Al). The organic layers include an 87 to 113-nm-thick hole transport layer (HTL) 1308 of EL022S (Hodogaya Chemical), a 10-nm-thick HTL layer 1312 of EL301 (Hodogaya Chemical), a 20-nm-thick emissive layer (EML) 1316 consisting of a 10% by volume mixture of BD200 (Sunfine Chemical) doped in BH900 (Sunfine Chemical) and a 50-nm-thick electron transport layer (ETL) 1320 of TPBi (1,3,5-Tris(1-phenyl-1Hbenzimidazol-2-yl)benzene, Lumtec). A 1.5-nm-thick electron injection layer (EIL) of Lithium Fluoride (LiF) was deposited between the ETL and the cathode. The cathode 1324 is formed from a 10% by volume mixture of Silver (Ag) doped in Magnesium (Mg). Above the cathode is a 65-nm-thick capping layer (CPL) 1328 of TCTA (4,4',4"-Tris(carbazol-9-yl)triphenylamine, Lumtec). Above the CPL is the thin-film encapsulation (TFE) 1332 which includes two inorganic layers of $Al_2O_3$ surrounding one layer of E-200 (EM Index).

Figure 14:
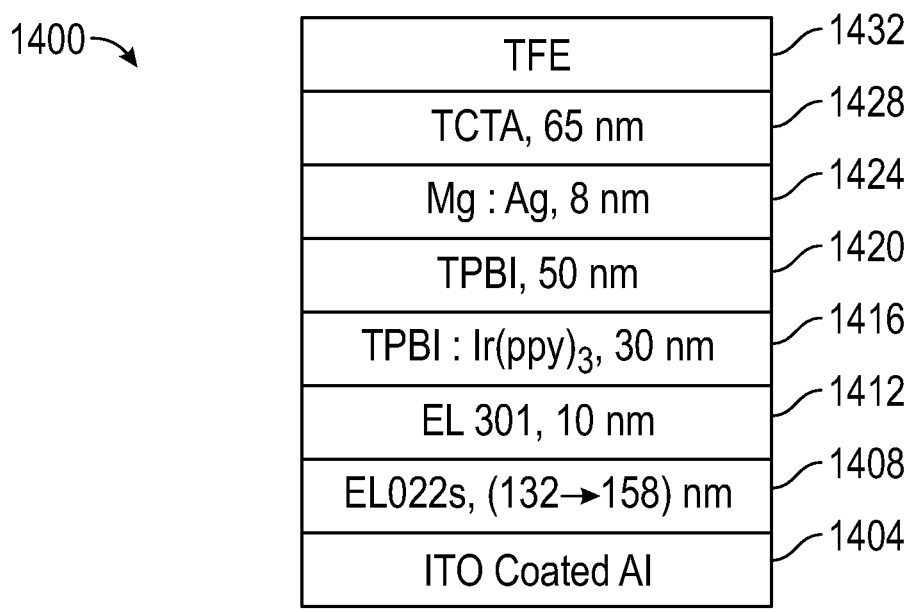
FIG. 14 is a cross-sectional view of an exemplary green OLED subpixel according to exemplary implementations of the present disclosure.

FIG. 14 is a cross-sectional view of a green OLED subpixel 1400. The anode 1404 is formed from indium-tin-oxide (ITO) deposited on a 100-nm-thick layer of Aluminum (Al). The organic layers include an 132 to 158-nm-thick hole transport layer (HTL) 1408 of EL022S (Hodogaya Chemical), a 10-nm-thick HTL layer 1412 of EL301 (Hodogaya Chemical), a 30-nm-thick emissive layer (EML) 1416 including a 10% by volume mixture of Ir(ppy)$_3$ (fac-Tris(2-phenylpyridine)iridium(III), Lumtec) doped in TPBi (1,3,5-Tris(1-phenyl-1Hbenzimidazol-2-yl)benzene, Lumtec) and a 50-nm-thick electron transport layer (ETL) 1420 of TPBi (Lumtec). The cathode 1424 is formed from a 10% by volume mixture of Silver (Ag) doped in Magnesium (Mg). Above the cathode is a 65-nm-thick capping layer (CPL) 1428 of TCTA (4,4',4"-Tris(carbazol-9-yl)triphenylamine, Lumtec). Above the CPL is the thin-film encapsulation (TFE) 1432 which includes two inorganic layers of $Al_2O_3$ surrounding one layer of E-200 (EM Index).

Figure 15:
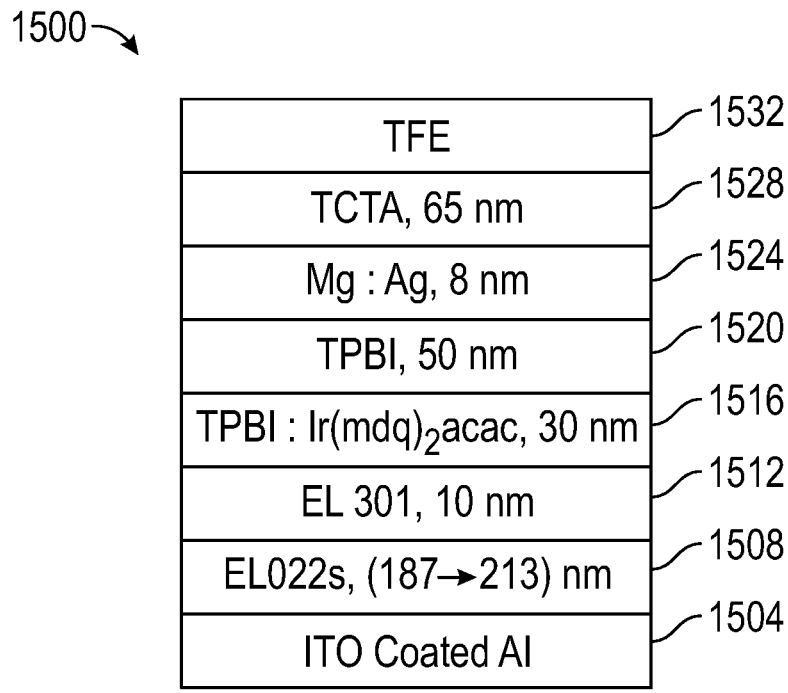
FIG. 15 is a cross-sectional view of an exemplary red OLED subpixel according to exemplary implementations of the present disclosure.

FIG. 15 is a cross-sectional view of a red OLED subpixel 1500. The anode 1504 is formed from indium-tin-oxide (ITO) deposited on a 100-nm-thick layer of Aluminum (Al). The organic layers include an 187 to 213-nm-thick hole transport layer (HTL) 1508 of EL022S (Hodogaya Chemical), a 10-nm-thick HTL layer 1512 of EL301 (Hodogaya Chemical), a 30-nm-thick emissive layer (EML) 1516 consisting of a 10% by volume mixture of Ir(mdq)$_2$(acac) (Bis(2-methyldibenzo[f,h]quinoxaline)(acetylacetonate) iridium(III), Lumtec) doped in TPBi (1,3,5-Tris(1-phenyl-1Hbenzimidazol-2-yl)benzene, Lumtec), and a 50-nm-thick electron transport layer (ETL) 1520 of TPBi (Lumtec). The cathode 1524 is formed from a 10% by volume mixture of Silver (Ag) doped in Magnesium (Mg). Above the cathode is a 65-nm-thick capping layer (CPL) 1528 of TCTA (4,4',4"-Tris(carbazol-9-yl)triphenylamine, Lumtec). Above the CPL is the thin-film encapsulation (TFE) 1532 which includes two inorganic layers of $Al_2O_3$ surrounding one layer of E-200 (EM Index).

Modeling Examples

Figure 16A:
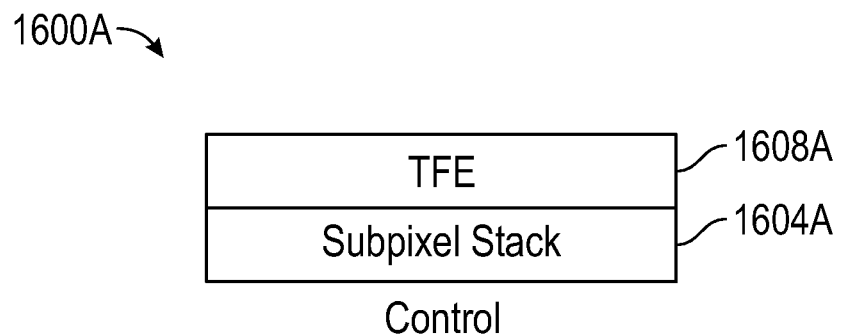
FIGS. 16A-16E illustrate configurations of exemplary OLED subpixel stacks according to exemplary implementations of the present disclosure.
Figure 16B:
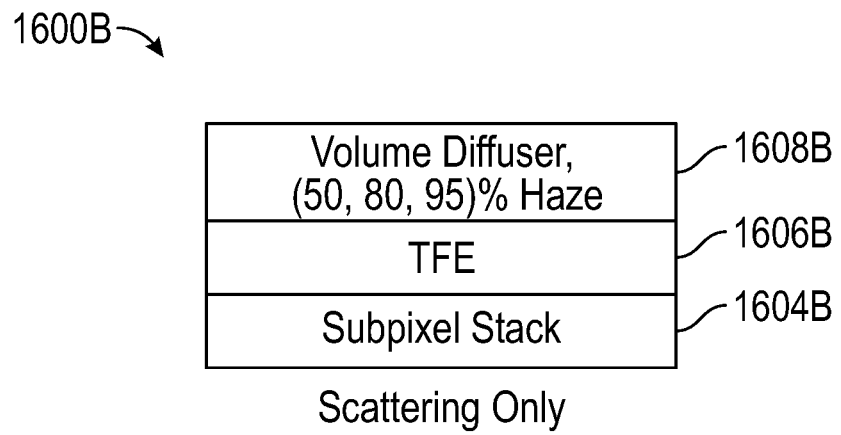
Figure 16C:
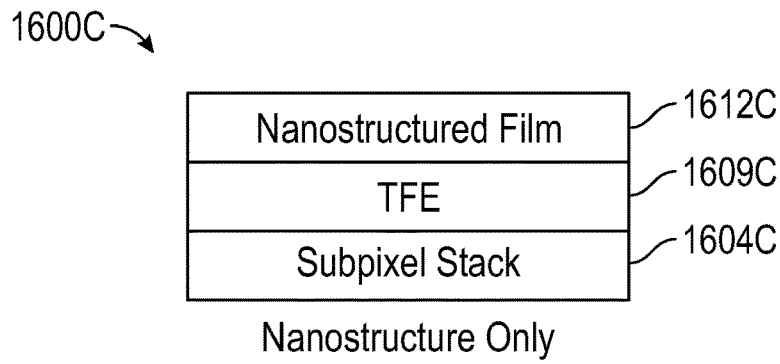
Figure 16D:
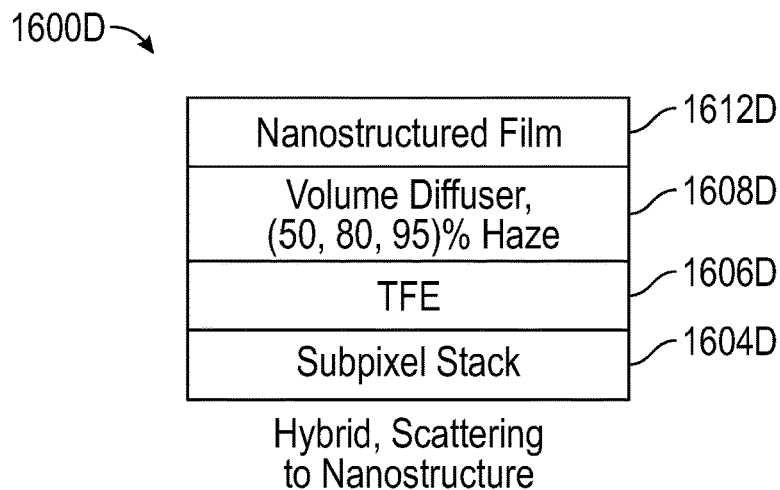
Figure 16E:
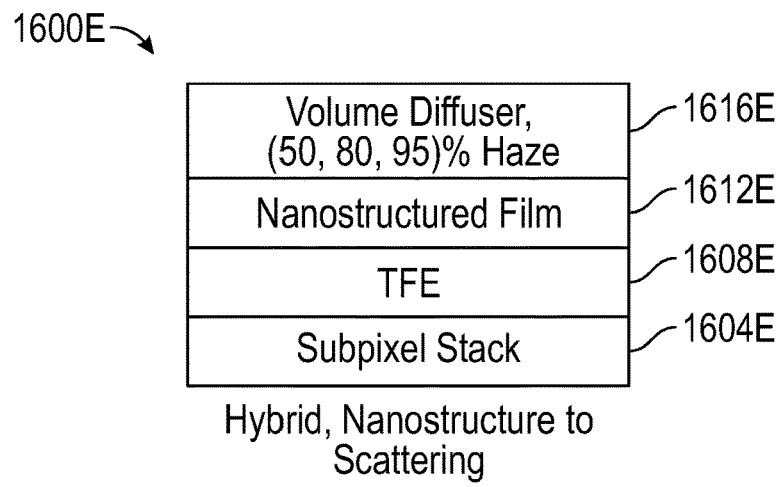

The OLED brightness and color performance for blue, green, and red OLED subpixels stacks were simulated using an optical model in the five configurations shown in FIGS. 16A-16E. FIG. 16A shows a control, FIG. 16B shows scattering only, FIG. 16C shows nanostructure only, FIG. 16D shows hybrid, scattering to nanostructure while FIG. 16E shows hybrid, nanostructure to scattering. Descriptions of these configurations are provided below. Inputs to the model include the ordering, thicknesses, indices of refraction and extinction coefficients for each layer. Indices of refraction and extinction coefficients for each layer were measured by variable angle spectroscopic ellipsometry (VASE) on a J.A. Woollam Spectroscopic Ellipsometer.

The control configuration (16A) 1600A is the case where no color correction component (CCC) is added on top of the red, green or blue OLED subpixel stack 1604A or TFE 1608A. In the second configuration (16B) 1600B, a volume diffuser CCC is added on top of the TFE 1606B. Three volume diffuser CCCs 1608B with varying levels of haze (50, 80, and 95%) are modeled above the subpixel stack 1604B. In the third case (16C) 1600C, a nanostructured film CCC 1612C is added on top of the TFE 1609C, and above the subpixel stack 1604C. In the fourth case (16D) 1600D, a combination of volume diffuser CCC 1608D and nanostructured film CCC 1612D is applied on top of the TFE 1606D, above subpixel stack 1604D, with the volume diffuser being between the TFE and nanostructured film. In the fifth case (16E) 1600E, a combination of nanostructured film CCC 1612E and volume diffuser 1616E is applied on top of the TFE 1608E, and above subpixel stack 1604E, with the nanostructured film being between the TFE and volume diffuser. In both the fourth and fifth cases the haze level of the volume diffuser is modeled at 50, 80 and 95% haze level.

Figure 17A:
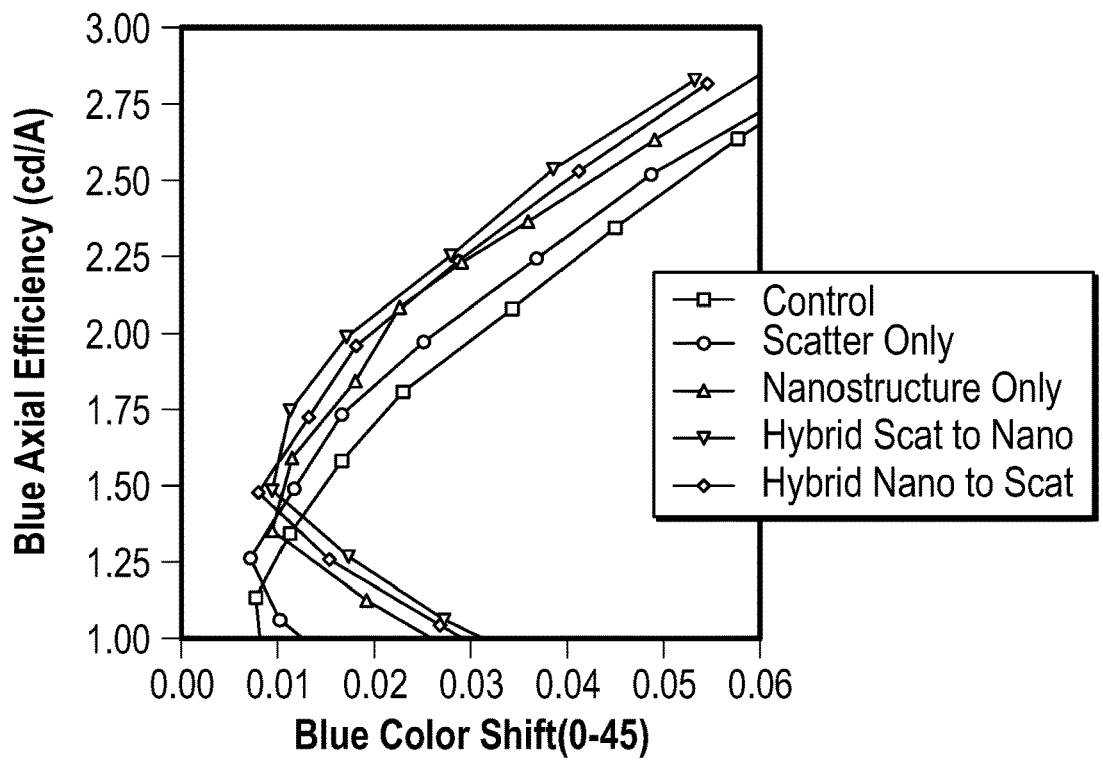
FIGS. 17A-17C illustrate exemplary modeling results for blue OLED subpixel designs described in FIG. 13 for each case described in FIGS. 16A-16E and for various haze levels present in a volume diffuser according to exemplary implementations of the present disclosure.
Figure 17B:
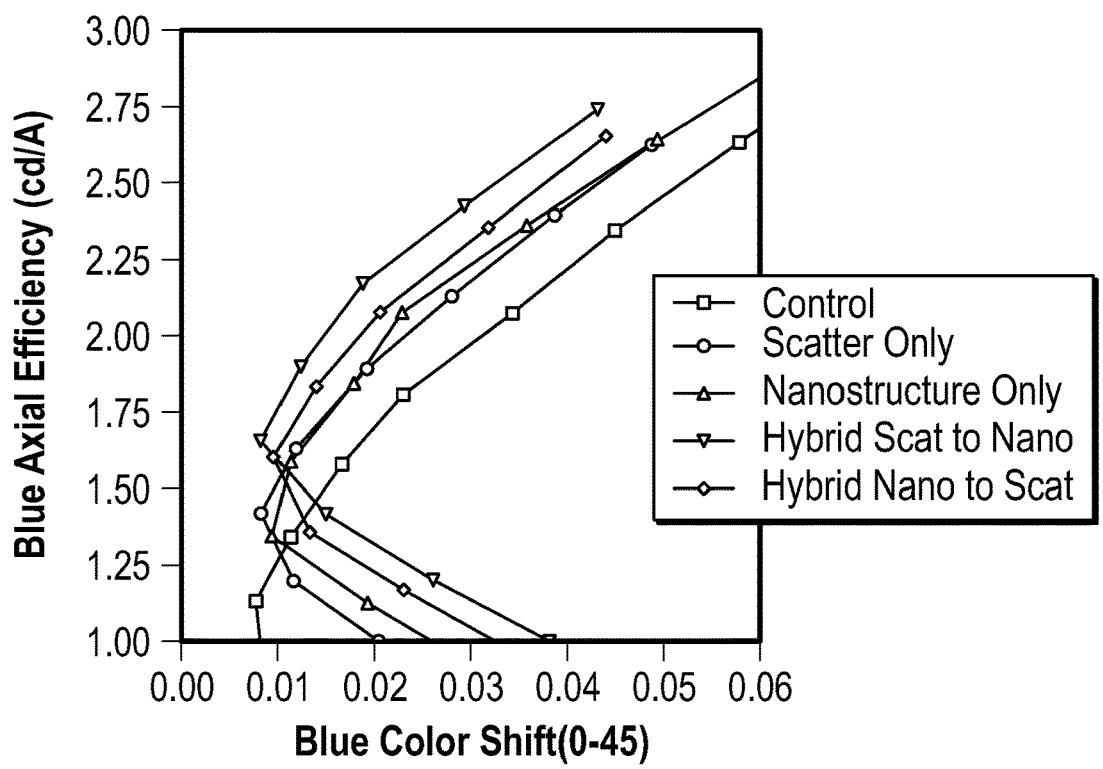
Figure 17C:
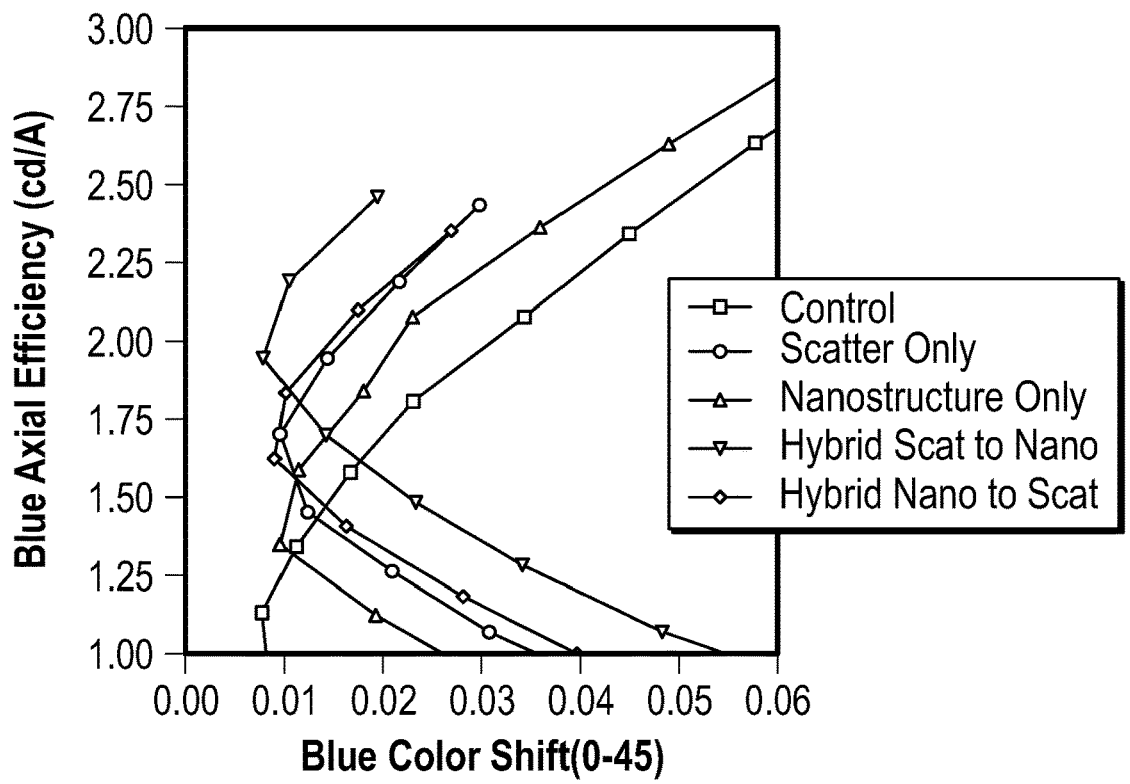

FIGS. 17A-17C show modeling results for the blue OLED subpixel designs described in FIG. 13 for each case described in FIGS. 16A-16E and for each haze level present in the volume diffuser, with FIG. 17A representing a scenario with 50% haze, FIG. 17B representing a scenario with 80% haze and FIG. 17C representing a scenario with 95% haze. Each plot compares the axial current efficiency versus the maximum color-shift between 0° and 45°. The color-shift for a given viewing angle (θ) is described as the length of the vector between the color coordinate in CIE 1976 color space at 0° (u'$_0$, v'$_0$) and at θ (u'$_θ$, v'$_θ$). Different points along the curve represent different HTL thicknesses according to FIG. 13. Optimal device behavior is high efficiency and low color-shift corresponding to the upper left portion of each plot. For each case, there exist blue subpixel stack designs which are above and/or to the left of the control curve signaling enhanced behavior. The magnitude of the enhancement depends on the level of haze present in the volume diffuser. For each haze level, the hybrid configuration with the volume diffuser between the TFE and the nanostructured film exhibits the largest enhancement.

The blue OLED subpixel improvement can be quantified in two ways. The first way to is track the axial efficiency for a device with a color-shift of 0.01. In this method the underlying stack design may change depending on the CCC applied. These results are summarized in Table 3. An efficiency enhancement from 1.1 cd/A to 1.5 cd/A was modeled with the 50% haze volume diffuser when either hybrid CCC is applied. An efficiency enhancement from 1.1 cd/A to 1.7 cd/A was also modeled when the 80% haze volume diffuser between TFE and nanostructured film hybrid CCC is applied. An efficiency enhancement from 1.1 cd/A to 1.9 cd/A was also modeled when the 95% haze volume diffuser between TFE and nanostructured film hybrid CCC is applied. In all cases a low blue color shift less than 0.01 is maintained.

TABLE 3

| Case | Haze of Volume Diffuser (%) | HTL Thickness (nm) | Color-Shift | Axial Efficiency (cd/A) |
| --- | --- | --- | --- | --- |
| Control | — | 99 | 0.008 | 1.1 |
| Scat Only | 50 | 101 | 0.007 | 1.3 |
| NS Only | — | 101 | 0.009 | 1.3 |
| Hybrid Scat to NS | 50 | 103 | 0.009 | 1.5 |
| Hybrid NS to Scat | 50 | 103 | 0.008 | 1.5 |
| Control | — | 99 | 0.008 | 1.1 |
| Scat Only | 80 | 103 | 0.008 | 1.4 |
| NS Only | — | 101 | 0.009 | 1.3 |
| Hybrid Scat to NS | 80 | 105 | 0.008 | 1.7 |
| Hybrid NS to Scat | 80 | 105 | 0.010 | 1.6 |
| Control | — | 99 | 0.008 | 1.1 |
| Scat Only | 95 | 107 | 0.009 | 1.7 |
| NS Only | — | 101 | 0.009 | 1.3 |
| Hybrid Scat to NS | 95 | 109 | 0.008 | 1.9 |
| Hybrid NS to Scat | 95 | 107 | 0.009 | 1.6 |

The second way is to track the color-shift and axial efficiency for a single subpixel design with an initial color-shift greater than 0.03. In this example, this corresponds to a blue subpixel design with an HTL thickness of 107 nm. Table 4 summarizes the results. A color-shift improvement from 0.034 to 0.017 was modeled when the 50% haze volume diffuser between TFE and nanostructured film hybrid CCC is applied. A color-shift improvement from 0.034 to 0.013 was modeled when the 80% haze volume diffuser between TFE and nanostructured film hybrid CCC is applied. A color-shift improvement from 0.034 to 0.009 was modeled when either the 95% haze volume diffuser CCC or 95% haze volume diffuser between TFE and nanostructured film hybrid CCC is applied.

TABLE 4

| Case | Haze of Volume Diffuser (%) | HTL Thickness (nm) | Color-Shift | Axial Efficiency (cd/A) |
| --- | --- | --- | --- | --- |
| Control | — | 107 | 0.034 | 2.1 |
| Scat Only | 50 | 107 | 0.025 | 2.0 |
| NS Only | — | 107 | 0.023 | 2.1 |
| Hybrid Scat to NS | 50 | 107 | 0.017 | 2.0 |
| Hybrid NS to Scat | 50 | 107 | 0.018 | 2.0 |
| Control | — | 107 | 0.034 | 2.1 |
| Scat Only | 80 | 107 | 0.019 | 1.9 |
| NS Only | — | 107 | 0.023 | 2.1 |
| Hybrid Scat to NS | 80 | 107 | 0.013 | 1.9 |
| Hybrid NS to Scat | 80 | 107 | 0.014 | 1.8 |
| Control | — | 107 | 0.034 | 2.1 |
| Scat Only | 95 | 107 | 0.009 | 1.7 |
| NS Only | — | 107 | 0.023 | 2.1 |
| Hybrid Scat to NS | 95 | 107 | 0.014 | 1.7 |
| Hybrid NS to Scat | 95 | 107 | 0.009 | 1.6 |

Figure 18A:
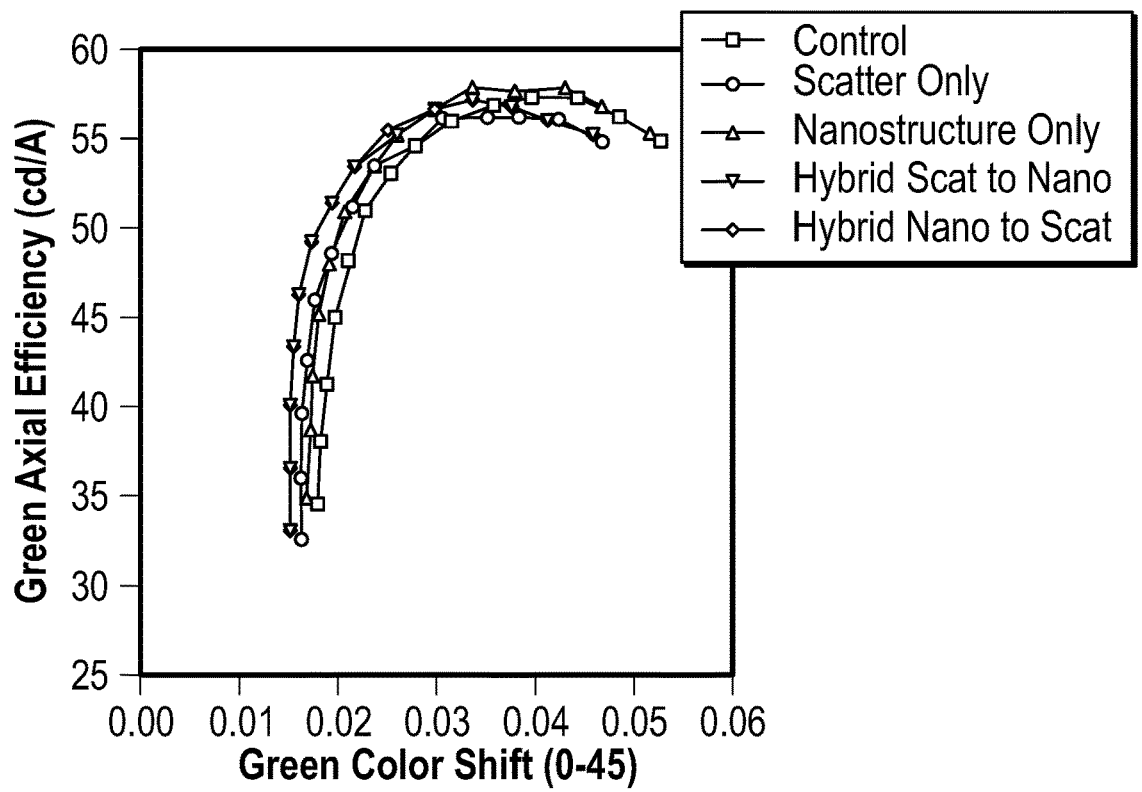
FIGS. 18A-18C illustrate exemplary modeling results for green OLED subpixel designs described in FIG. 14 for each case described in FIGS. 16A-16E and for various haze levels present in a volume diffuser according to exemplary implementations of the present disclosure.
Figure 18B:
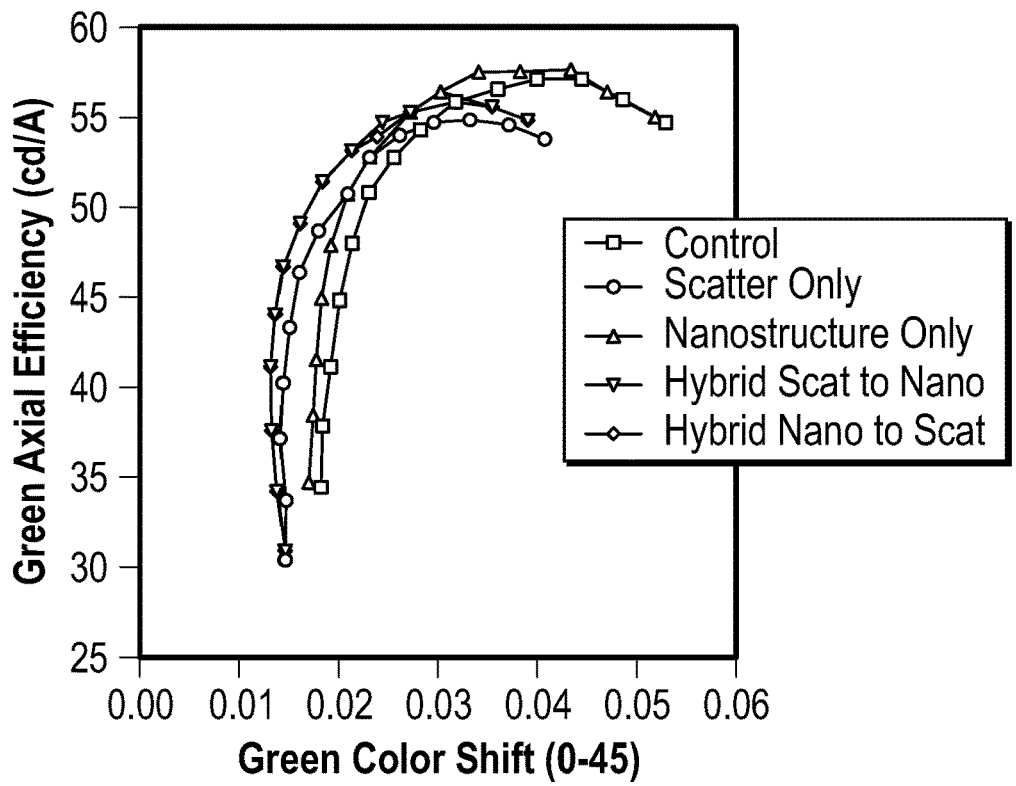
Figure 18C:
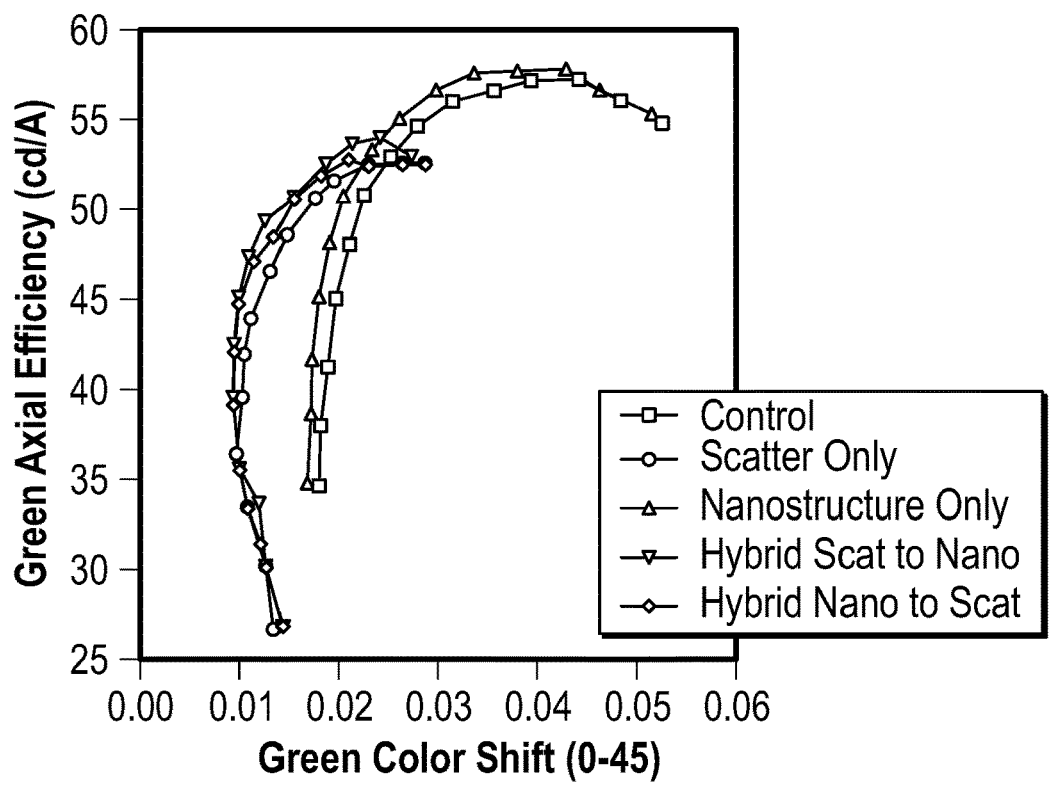
Figure 19A:
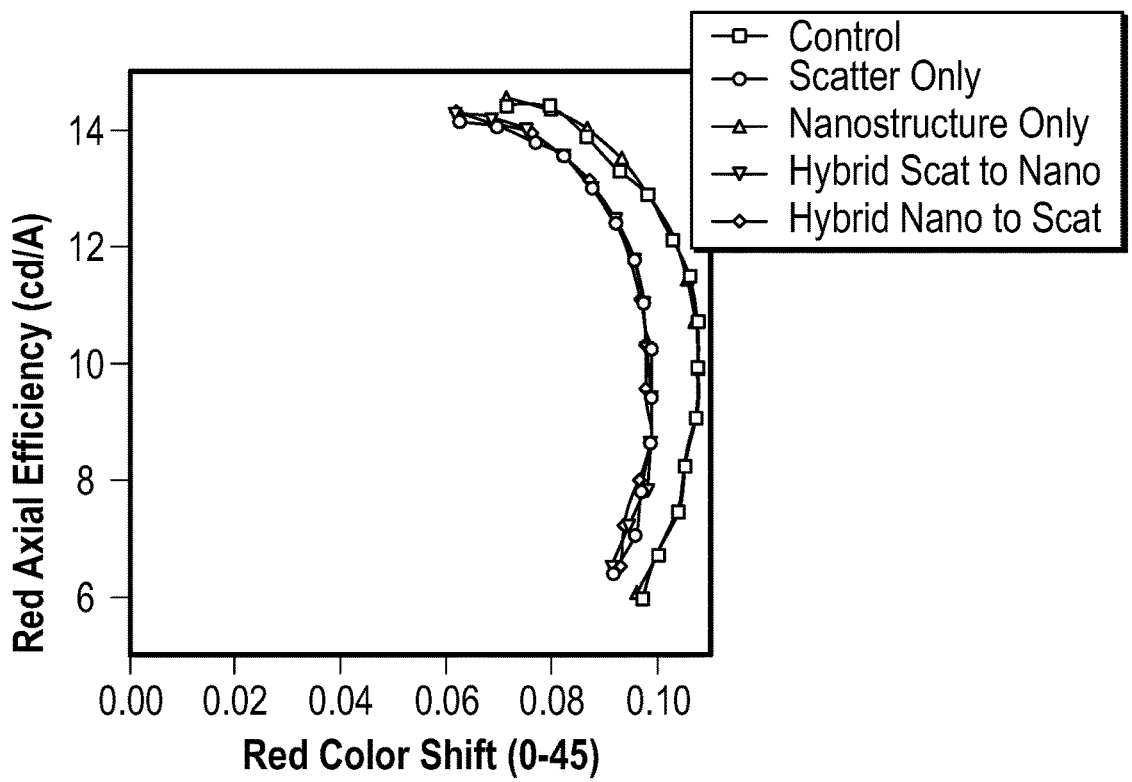
FIGS. 19A-19C illustrate exemplary modeling results for red OLED subpixel designs described in FIG. 15 for each case described in FIGS. 16A-16E and for various haze levels present in a volume diffuser according to exemplary implementations of the present disclosure.
Figure 19B:
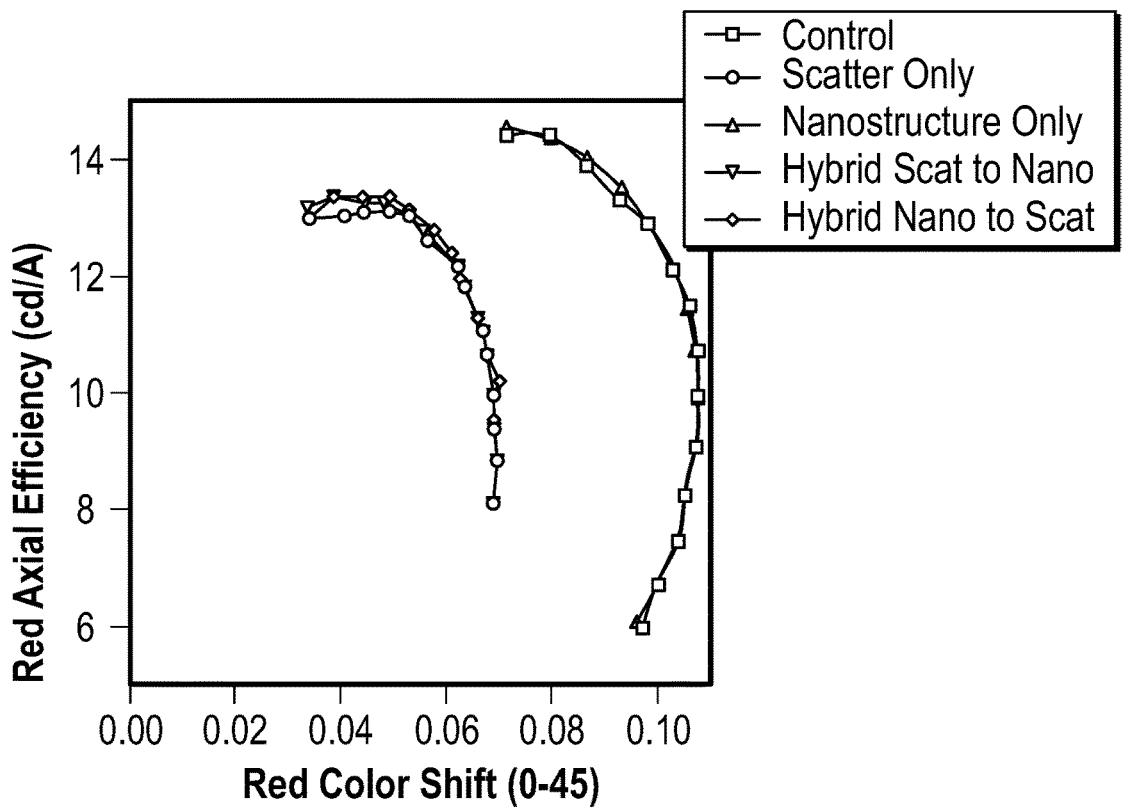
Figure 19C:
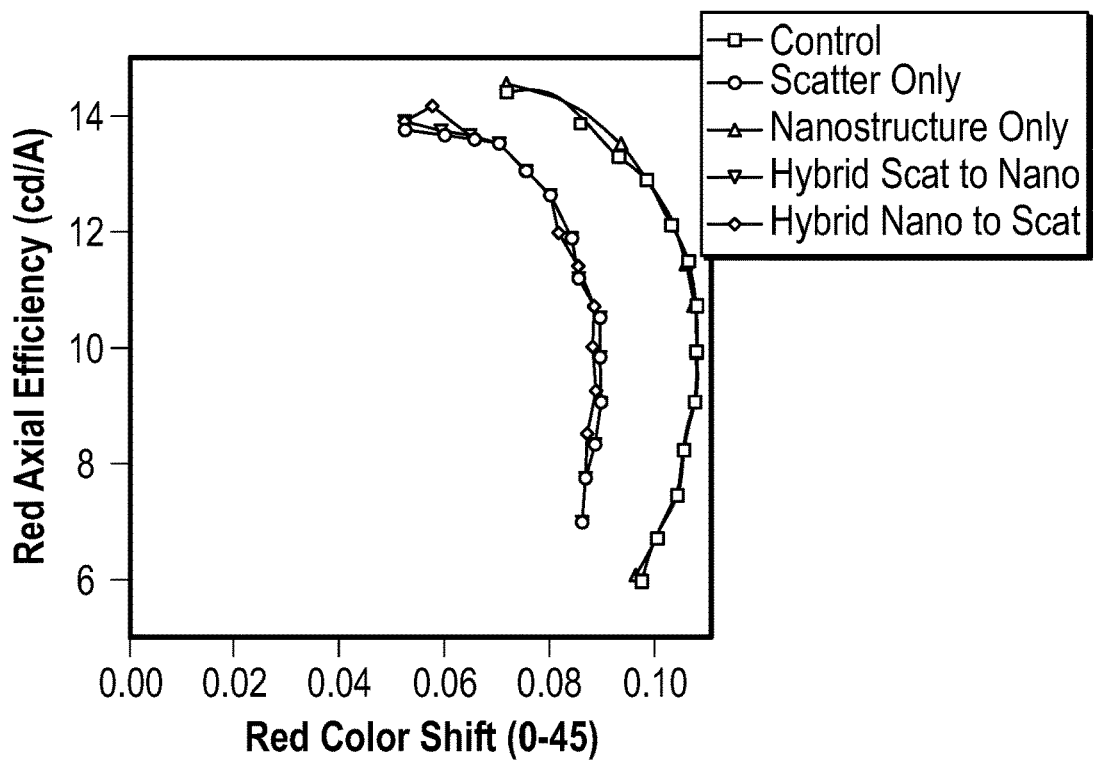

FIGS. 18A-18C show modeling results for the green OLED subpixel designs described in FIG. 14 for each case described in FIGS. 16A-16E and for each haze level present in the volume diffuser, with FIG. 18A representing a scenario having 50% haze, FIG. 18B representing a scenario having 80% haze and FIG. 18C representing a scenario having 95% haze. FIGS. 19A-19C show the modeling results for the red OLED subpixel designs described in FIG. 15 for each case described in FIGS. 16A-16E and for each haze level present in the volume diffuser, with FIG. 19A representing a scenario having 50% haze, FIG. 19B representing a scenario having 80% haze and FIG. 19C representing a scenario having 95% haze. For both green and red OLED subpixels, the effect of the nanostructured film CCC is small to negligible, in agreement with expectations. As a result, the volume diffuser and each hybrid case show similar behavior for each given haze level present in the volume diffuser.

In each case and for each haze level there is a 2-15% reduction in the green axial efficiency and a 15-60% reduction in the green-color shift as seen in Table 5.

$$CMW[\theta] = \frac{E[\theta]}{CIE_y[\theta]}$$

$$RMSCB = \sqrt{\sum_{\theta=0}^{45} \sum_{c=r,g,b} (CMW_c - CMW_{avg})^2}$$

Second, only white pixel designs with an average primary (e.g. red, green, blue) color-shift of <0.04 are selected.

Once all white designs are simulated, a performance boundary in white axial efficiency/white color-shift perfor-

TABLE 5

| Case | Haze of Volume Diffuser (%) | HTL Thickness (nm) | Color-Shift | Axial Efficiency (cd/A) | Color-Shift Reduction (%) | Axial Efficiency Reduction (%) |
|---|---|---|---|---|---|---|
| Control | — | 146 | 0.028 | 54.6 | 0 | 0.0 |
| Scat Only | 50 | 146 | 0.024 | 53.4 | 15 | 2.2 |
| NS Only | — | 146 | 0.026 | 55.2 | 6 | −1.1 |
| Hybrid Scat to NS | 50 | 146 | 0.022 | 53.4 | 23 | 2.2 |
| Hybrid NS to Scat | 50 | 146 | 0.022 | 53.5 | 22 | 2.0 |
| Control | — | 146 | 0.028 | 54.6 | 0 | 0.0 |
| Scat Only | 80 | 146 | 0.021 | 50.9 | 27 | 6.8 |
| NS Only | — | 146 | 0.026 | 55.2 | 6 | −1.1 |
| Hybrid Scat to NS | 80 | 146 | 0.018 | 51.3 | 35 | 6.1 |
| Hybrid NS to Scat | 80 | 146 | 0.018 | 51.8 | 35 | 5.1 |
| Control | — | 146 | 0.028 | 54.6 | 0 | 0.0 |
| Scat Only | 95 | 146 | 0.013 | 46.5 | 52 | 14.8 |
| NS Only | — | 146 | 0.026 | 55.2 | 6 | −1.1 |
| Hybrid Scat to NS | 95 | 146 | 0.011 | 47.5 | 60 | 13.0 |
| Hybrid NS to Scat | 95 | 146 | 0.012 | 47.2 | 58 | 13.3 |

Figure 20A:
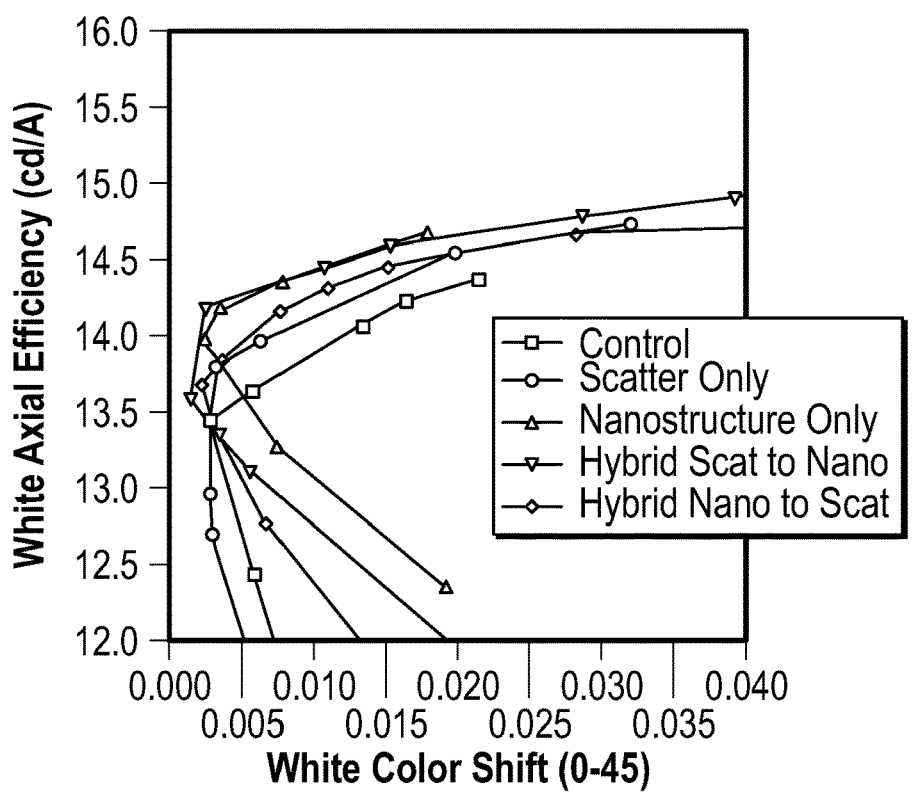
FIGS. 20A-20C illustrate exemplary performance boundaries in a white axial efficiency/white color-shift performance space that enclose all performance points for a given color correction component for varying haze levels of a volume diffuser according to exemplary implementations of the present disclosure.
Figure 20B:
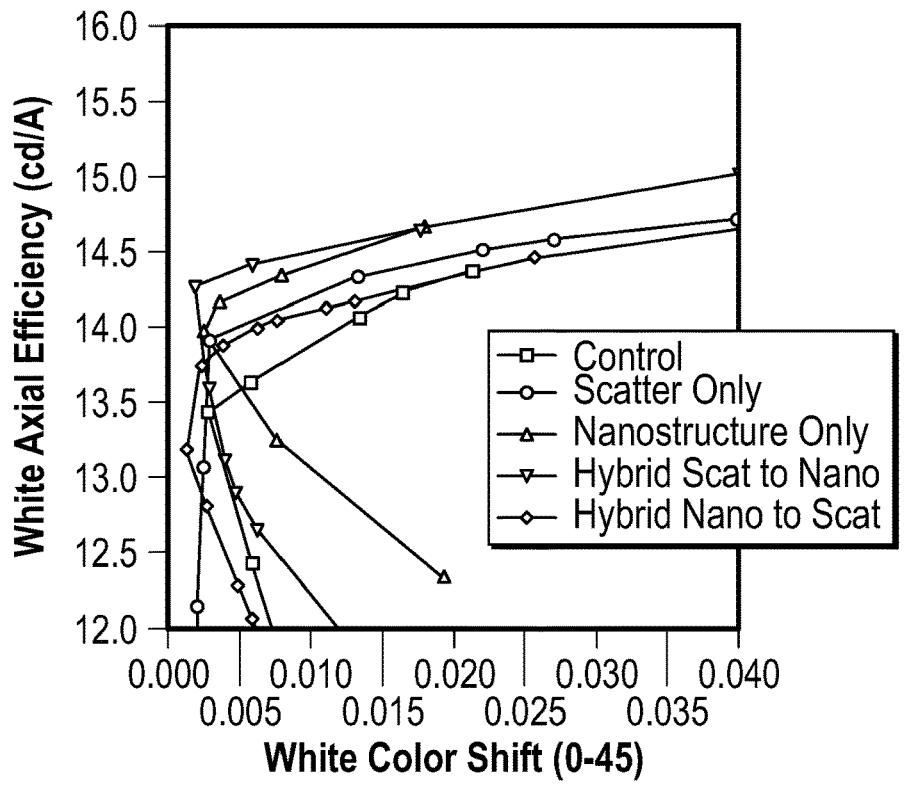
Figure 20C:
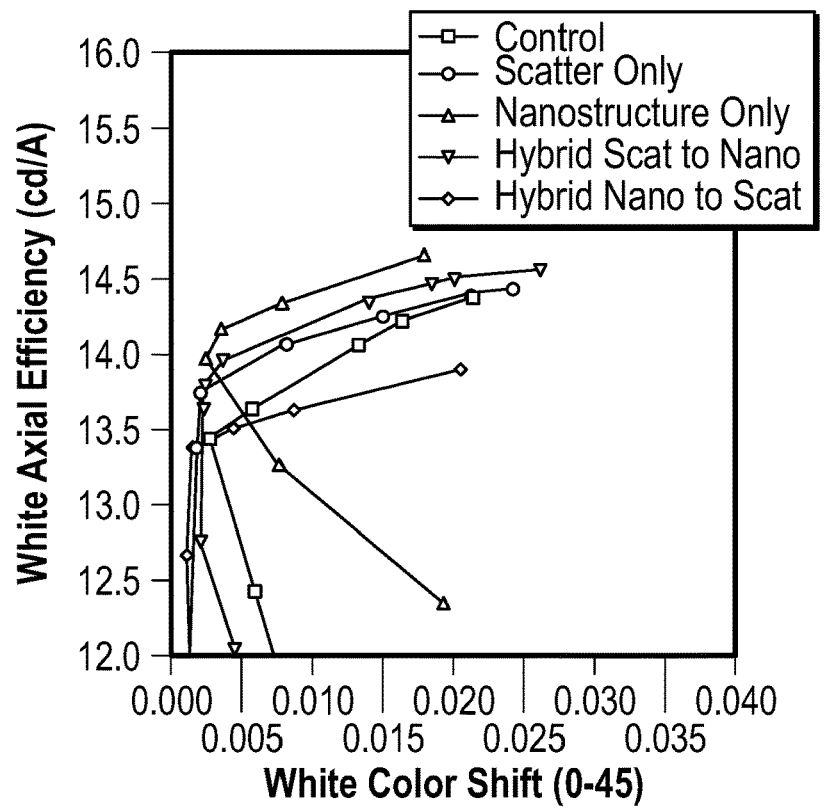

For red OLED subpixels, a 10-40% reduction in the red color-shift and a 0-10% enhancement in the axial efficiency was modeled as summarized in Table 6.

mance space can be drawn which encloses all performance points for a given CCC. These performance boundaries are shown in FIGS. 20A-20C for each varying haze level of

TABLE 6

| Case | Haze of Volume Diffuser (%) | HTL Thickness (nm) | Color-Shift | Axial Efficiency (cd/A) | Color-Shift Reduction (%) | Axial Efficiency Reduction (%) |
|---|---|---|---|---|---|---|
| Control | — | 201 | 0.1082363 | 10.7262 | 0 | 0.0 |
| Scat Only | 50 | 201 | 0.0969041 | 11.0842 | 10 | −3.3 |
| NS Only | — | 201 | 0.1074182 | 10.753 | 1 | −0.2 |
| Hybrid Scat to NS | 50 | 201 | 0.0973808 | 10.9823 | 10 | −2.4 |
| Hybrid NS to Scat | 50 | 201 | 0.0975282 | 10.9869 | 10 | −2.4 |
| Control | — | 201 | 0.1082363 | 10.7262 | 0 | 0.0 |
| Scat Only | 80 | 201 | 0.0848504 | 11.2395 | 22 | −4.8 |
| NS Only | — | 201 | 0.1074182 | 10.753 | 1 | −0.2 |
| Hybrid Scat to NS | 80 | 201 | 0.0855609 | 11.3041 | 21 | −5.4 |
| Hybrid NS to Scat | 80 | 201 | 0.0844506 | 11.4065 | 22 | −6.3 |
| Control | — | 201 | 0.1082363 | 10.7262 | 0 | 0.0 |
| Scat Only | 95 | 201 | 0.0640842 | 11.7799 | 41 | −9.8 |
| NS Only | — | 201 | 0.1074182 | 10.753 | 1 | −0.2 |
| Hybrid Scat to NS | 95 | 201 | 0.0625659 | 11.8806 | 42 | −10.8 |
| Hybrid NS to Scat | 95 | 201 | 0.0625564 | 11.8692 | 42 | −10.7 |

With modeled performances for red, green, and blue OLED subpixels for with each type of CCC, the performance of an OLED pixel whose performance is based on the preceding subpixels can be simulated. Potential white pixel designs are selected according to the following procedure.

First, only white pixel designs with a root-mean-squared deviation from balanced color (RMSCB) of <0.1 are selected. RMSCB is defined according to the following equation where $\theta$ is the viewing angle, c is the subpixel color, CMWB is the color mixing weight, E is the efficiency at a given viewing angle, and $CIE_y$ is the y-coordinate of the color point in CIE 1931 colorspace at a given viewing angle. $CMW_{avg}$ is the average color mixing weight between all three colors at a given viewing angle.

volume diffuser, with FIG. 20A representing a scenario having 50% haze, FIG. 20B representing a scenario having 80% haze and FIG. 20C representing a scenario having 95% haze. As with the subpixel performance, performance curves which contain designs in the upper left portion of the plot are optimal. For the 50% haze volume diffuser cases, an equivalent performance enhancement is modeled for the hybrid CCC with the volume diffuser between the TFE and nanostructured film and the nanostructure film only CCC. For the 80% case, the hybrid CCC with the volume diffuser between the TFE and nanostructured film is optimal. For the 95% case the nanostructured film only CCC is optimal. Table 7 summarizes modeled axial efficiencies for white pixel designs with a white color-shift less than 0.075.

TABLE 7

| Case | Haze of Volume Diffuser (%) | Blue HTL Thickness (nm) | Green HTL Thickness (nm) | Red HTL Thickness (nm) | Color-Shift | Axial Efficiency (cd/A) |
|---|---|---|---|---|---|---|
| Control | — | 103 | 138 | 189 | 0.006 | 13.6 |
| Scat Only | 50 | 105 | 142 | 193 | 0.006 | 14.0 |
| NS Only | — | 107 | 138 | 187 | 0.004 | 14.2 |
| Hybrid Scat to NS | 50 | 109 | 142 | 189 | 0.007 | 14.3 |
| Hybrid NS to Scat | 50 | 107 | 142 | 191 | 0.007 | 14.0 |
| Control | — | 103 | 138 | 189 | 0.006 | 13.6 |
| Scat Only | 80 | 107 | 146 | 197 | 0.006 | 14.0 |
| NS Only | — | 107 | 138 | 187 | 0.004 | 14.2 |
| Hybrid Scat to NS | 80 | 111 | 146 | 193 | 0.006 | 14.4 |
| Hybrid NS to Scat | 80 | 109 | 146 | 195 | 0.006 | 14.0 |
| Control | — | 103 | 138 | 189 | 0.006 | 13.6 |
| Scat Only | 95 | 113 | 152 | 201 | 0.006 | 13.9 |
| NS Only | — | 107 | 138 | 187 | 0.004 | 14.2 |
| Hybrid Scat to NS | 95 | 113 | 150 | 197 | 0.007 | 14.1 |
| Hybrid NS to Scat | 95 | 113 | 154 | 201 | 0.006 | 13.5 |

EXPERIMENTAL EXAMPLES

Figure 21:
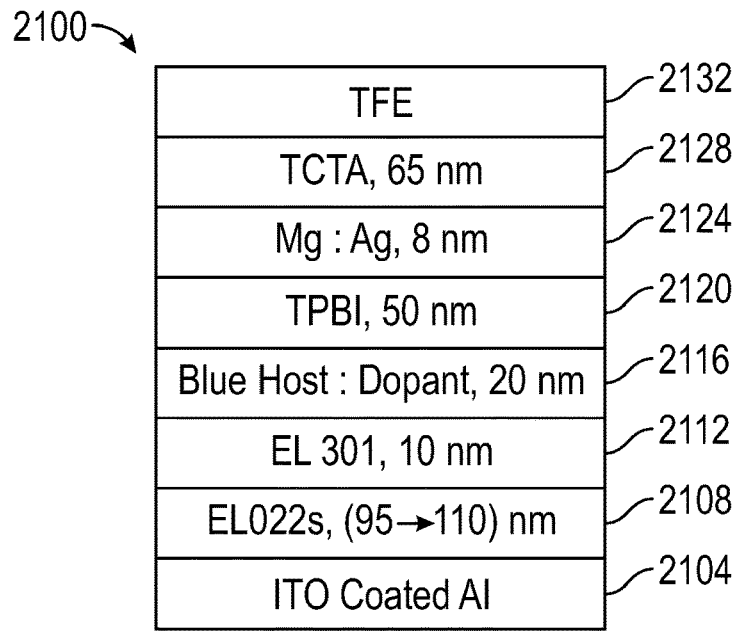
FIG. 21 illustrates an exemplary blue OLED subpixel design according to exemplary implementations of the present disclosure.

Blue OLED subpixel prototypes 2100 were fabricated according to the layer structure detailed in FIG. 21. The anode 2104 is formed from indium-tin-oxide (ITO) deposited on a 100-nm-thick layer of Aluminum (Al). The metal and organic layers were deposited via vacuum thermal evaporation at a pressure of $10^{-7}$ Torr. The organic layers include a hole transport layer (HTL) 2108 of EL022S (Hodogaya Chemical), a 10-nm-thick HTL layer 2112 of EL301 (Hodogaya Chemical), a 20-nm-thick emissive layer (EML) 2116 including of a 10% by volume mixture of BD200 (Sunfine Chemical) doped in BH900 (Sunfine Chemical) and a 50-nm-thick electron transport layer (ETL) 2120 of TPBi (Lumtec). The thickness of the HTL was varied between 95 and 110 nm. The cathode 2124 is formed from a 10% by volume mixture of Silver (Ag) doped in Magnesium (Mg). Above the cathode is a 65-nm-thick capping layer (CPL) 2128 of TCTA (4,4',4"-Tris(carbazol-9-yl)triphenylamine, Lumtec). Above the CPL is the thin-film encapsulation (TFE) 2132 which consists of two inorganic layers of $Al_2O_3$ surrounding one layer of E-200 (EM Index).

Figure 22A:
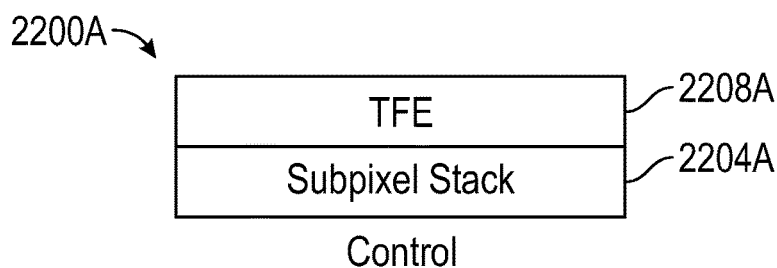
FIGS. 22A-22E illustrate various exemplary OLED subpixel configurations according to exemplary implementations of the present disclosure.
Figure 22B:
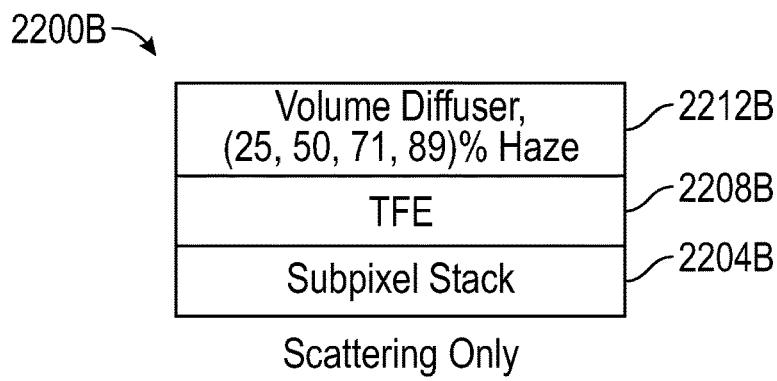
Figure 22C:
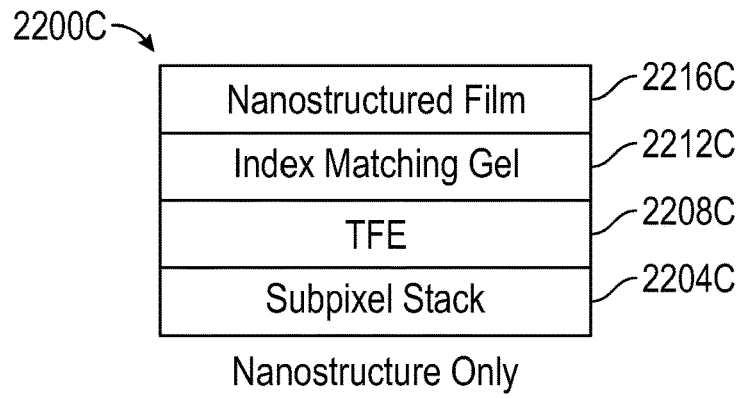
Figure 22D:
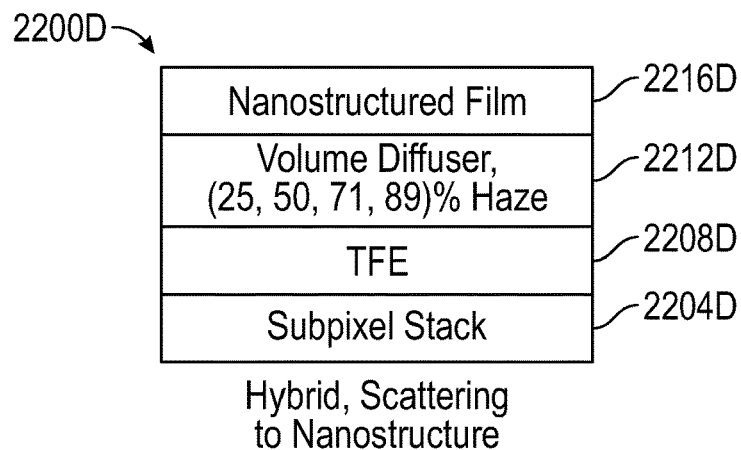
Figure 22E:
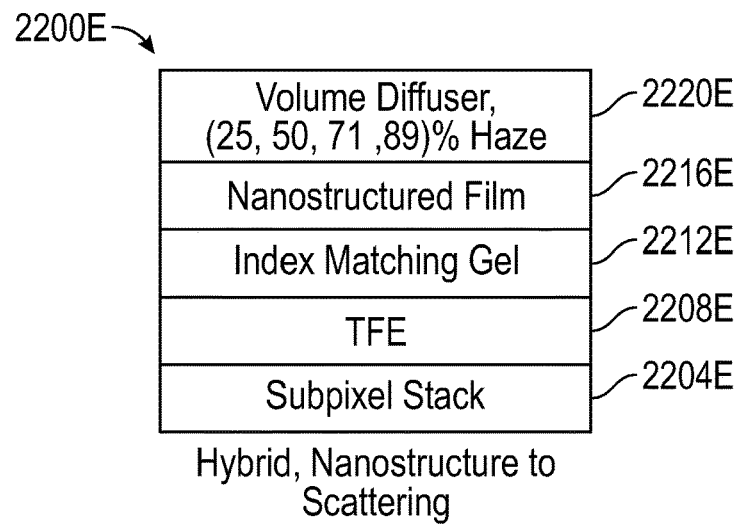

The OLED subpixel brightness and color were recorded as a function of viewing angle in the five configurations shown in FIGS. 22A-22E, where FIG. 22A shows a control configuration 2200A including a subpixel stack 2204A and a TFE 2208A, FIG. 22B shows a scattering only configuration 2200B including a subpixel stack 2204B, a TFE 2208B and a volume diffuser 2212B, FIG. 22C shows a nanostructure only configuration 2200C including a subpixel stack 2204C, a TFE 2208C, an index matching gel 2212 C and a nanostructured film 2216C, FIG. 22D shows a hybrid, scattering to nanostructure configuration 2200D including a subpixel stack 2204D, a TFE 2208D, a volume diffuser 2212D and a nanostructured film 2216D while FIG. 22E shows hybrid, nanostructure to scattering configuration 2200E including a subpixel stack 2204E, a TFE 2208E, an index matching gel 2212E, a nanostructured film 2216E and a volume diffuser 2220E. Brightness and spectral information were recorded with a PR650 spectroradiometer (Photo Research). An index matching gel (index of refraction=1.46) was used to optically laminate the nanostructured film to the TFE as needed. Four different haze levels (25, 50, 71, and 89%) for the volume diffuser were used in the scattering only and hybrid configurations.

TABLE 8

| Case | Haze (%) | Avg. Axial Efficiency (cd/A) | Axial Efficiency Std. Dev. (cd/A) | Avg. Color-Shift | Color-Shift Std. Dev. |
|---|---|---|---|---|---|
| Control | — | 1.5 | 0.09 | 0.017 | 0.0019 |
| Scat Only | 25 | 1.5 | 0.14 | 0.012 | 0.0032 |
| NS Only | — | 1.6 | 0.11 | 0.013 | 0.0032 |
| Hybrid NS to Scat | 25 | 1.6 | 0.19 | 0.012 | 0.0029 |
| Hybrid Scat to NS | 25 | 1.6 | 0.17 | 0.012 | 0.0026 |
| Control | — | 1.5 | 0.06 | 0.018 | 0.0016 |
| Scat Only | 50 | 1.6 | 0.11 | 0.016 | 0.0028 |
| NS Only | — | 1.7 | 0.29 | 0.013 | 0.0032 |
| Hybrid NS to Scat | 50 | 1.6 | 0.17 | 0.013 | 0.0041 |
| Hybrid Scat to NS | 50 | 1.7 | 0.15 | 0.013 | 0.0026 |
| Control | — | 1.5 | 0.06 | 0.018 | 0.0016 |
| Scat Only | 71 | 1.9 | 0.16 | 0.012 | 0.0026 |
| NS Only | — | 1.9 | 0.03 | 0.019 | 0.001 |
| Hybrid NS to Scat | 71 | 1.8 | 0.1 | 0.012 | 0.0016 |
| Hybrid Scat to NS | 71 | 1.9 | 0.23 | 0.016 | 0.0024 |
| Control | — | 1.5 | 0.06 | 0.018 | 0.0016 |
| Scat Only | 89 | 2.1 | 0.21 | 0.014 | 0.0037 |
| NS Only | — | 1.6 | 0.07 | 0.014 | 0.0029 |
| Hybrid NS to Scat | 89 | 2 | 0.2 | 0.013 | 0.0021 |
| Hybrid Scat to NS | 89 | 2.3 | 0.17 | 0.013 | 0.0027 |

To determine the efficiency enhancement possible for each configuration, the subpixels which demonstrated a color-shift less than 0.02 were selected and the mean and standard deviation for the axial efficiency and color-shift were tabulated. Table 8 summarizes the axial efficiency and color-shift for each configuration for each haze level present in the volume diffuser. For the 25% haze level diffuser the nanostructured film only and both hybrid configurations exhibit the largest efficiency enhancement from 1.5 cd/A to 1.6 cd/A. For the 50% haze level diffuser the nanostructured film only and hybrid with scattering between the TFE and nanostructured film exhibit the largest efficiency enhancement from 1.5 cd/A to 1.7 cd/A. For the 71% haze level diffuser the scattering only, nanostructured film only, and hybrid with scattering between the TFE and nanostructured film exhibit the largest efficiency enhancement from 1.5 cd/A to 1.9 cd/A. For the 89% haze level diffuser the hybrid with scattering between the TFE and nanostructured film exhibits the largest efficiency enhancement from 1.5 cd/A to 2.3 cd/A.

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 10 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.9 and 1.1, and that the value could be 1.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. An organic light emitting diode (OLED) display, comprising:
   a pixelated OLED display panel including a plurality of pixels, each pixel including a plurality of subpixels, each subpixel including a plurality of OLED layers; and
   a hybrid color correction component disposed on the pixelated OLED display panel, the hybrid color-correction component including:
   a nanostructured interface; and
   an angular transformation layer, the angular transformation layer disposed between the nanostructured interface and the pixelated OLED display panel,
   wherein the pixelated OLED display panel has a maximum blue subpixel color shift as view angle varies from 0 to 45 degrees of $BPCS^o_{45}$, $BPCS^o_{45}$ being at least 0.015; and
   wherein the OLED display has a maximum blue subpixel color shift as view angle varies from 0 to 45 degrees of $BPCS_{45}$, $BPCS_{45}^o$ - $BPCS_{45}$ being at least 0.005.

2. The OLED display of claim 1, wherein the angular transformation layer is a volumetric diffuser.

3. The OLED display of claim 1, wherein the angular transformation layer is a surface diffuser.

4. The OLED display of claim 1, wherein the angular transformation layer includes an angular transformation nanostructured interface.

5. The OLED display of claim 1, wherein the angular transformation layer includes a plurality of angular transformation nanostructured interfaces.

6. The OLED display of claim 1, wherein the angular transformation layer includes multilayer optical film.

7. The OLED display of claim 1, wherein the angular transformation layer includes a low index layer, the low index layer having an index of refraction below 1.4.

8. An organic light emitting diode (OLED) display, comprising:
   a pixelated OLED display panel including a plurality of pixels, each pixel including a plurality of subpixels, each subpixel including a plurality of OLED layers; and
   a hybrid color correction component disposed on the pixelated OLED display panel, the hybrid color-correction component including:
   a nanostructured interface; and
   an angular transformation layer, the angular transformation layer disposed between the nanostructured interface and the pixelated OLED display panel,
   wherein a comparative OLED display panel, otherwise identical to the pixelated OLED display panel, includes comparative pixels having a maximum white-point color shift as a view angle varies from 0 to 45 degrees of $WPCS^C_{45}$ and a largest acceptable white-point color shift as view angle varies from 0 to 45 degrees of $WPCS^C_{45}$, and where $WPCS^C{45} < WPCS^{LA}_{45}$, and
   wherein the pixelated OLED display panel, when the hybrid color correction component is disposed on the pixelated OLED display panel, includes pixels having a maximum white-point color shift as view angle varies from 0 to 45 degrees of $WPCS_{45}$, and where $WPCS_{45} < WPCS^C_{45} - 005$.

9. The OLED display of claim 8, wherein the pixelated OLED display panel, without the hybrid color correction component disposed on the pixelated OLED display panel, has a maximum white-point color shift as view angle varies from 0 to 45 degrees of $WPCS^o_{45}$, and where $WPCS^o_{45} > WPCS^{LA}_{45}$.

10. The OLED display of claim 8, wherein the angular transformation layer is a volumetric diffuser.

11. The OLED display of claim 8, wherein the angular transformation layer is a surface diffuser.

12. The OLED display of claim 8, wherein the angular transformation layer includes an angular transformation nanostructured interface.

13. The OLED display of claim 8, wherein the angular transformation layer includes a low index layer, the low index layer having an index of refraction below 1.4.

14. An organic light emitting diode (OLED) display, comprising:

a pixelated OLED display panel including a plurality of pixels, each pixel including a plurality of subpixels, each subpixel including a plurality of OLED layers; and a hybrid color correction component disposed on the pixelated OLED display panel, the hybrid color-correction component including:

a nanostructured interface; and an angular transformation layer, the angular transformation layer disposed between the nanostructured interface and the pixelated OLED display panel, wherein a comparative OLED display panel, otherwise identical to the pixelated OLED display panel, includes comparative pixels including comparative subpixels, each comparative subpixel having a maximum color shift as a view angle varies from 0 to 45 degrees of $SPCS^C_{45}$ and a largest acceptable subpixel color shift as view angle varies from 0 to 45 degrees of $SPCS^{LA}_{45}$, and where $SPCS^C_{45} < SPCS^{LA}_{45}$, and wherein the pixelated OLED display panel, when the hybrid color correction component is disposed on the pixelated OLED display panel, includes subpixels having a maximum color shift as view angle varies from 0 to 45 degrees of $SPCS_{45}$, and where $SPCS_{45} < SPCS^C_{45} - 005$.

15. The OLED display of claim 14, wherein the pixelated OLED display panel, without the hybrid color correction component disposed on the pixelated OLED display panel, each subpixel having a maximum color shift as view angle varies from 0 to 45 degrees of $SPCS^O_{45}$, and where $SPCS^O_{45} > SPCS^{LA}_{45}$.

16. The OLED display of claim 14, wherein the angular transformation layer is a volumetric diffuser.

17. The OLED display of claim 14, wherein the angular transformation layer is a surface diffuser.

18. The OLED display of claim 14, wherein the angular transformation layer includes an angular transformation nanostructured interface.

19. The OLED display of claim 14, wherein the angular transformation layer includes a low index layer, the low index layer having an index of refraction below 1.4.

20. The OLED display of claim 1, wherein $BPCS^O_{45}$ is at least 0.02 and $BPCS_{45}^O - BPCS_{45}$ is at least 0.015.

* * * * *

UNITED STATES PATENT AND TRADEMARK OFFICE
CERTIFICATE OF CORRECTION

PATENT NO. : 12,133,415 B2
APPLICATION NO. : 17/603104
DATED : October 29, 2024
INVENTOR(S) : Stephen M. Menke Page 1 of 1

It is certified that error appears in the above-identified patent and that said Letters Patent is hereby corrected as shown below:

In the Claims

Column 28

Lines 42-43, In Claim 8, delete "0 to 45 degrees of $WPCS^c{}_{45}$" and insert -- 0 to 45 degrees of $WPCS^{LA}{}_{45}$ --, therefor.

Line 43, In Claim 8, delete "$WPCS^c\ 45<WPCS^{LA}{}_{45}$" and insert -- $WPCS^c{}_{45}<WPCS^{LA}{}_{45}$ --, therefor.

Line 49, In Claim 8, delete "$WPCS_{45}< WPCS^c{}_{45}-005$" and insert -- $WPCS_{45}< WPCS^c{}_{45}-.005$ --, therefor.

Column 30

Line 3, In Claim 14, delete "$SPCS_{45}< SPCS^c{}_{45}-005$" and insert -- $SPCS_{45}< SPCS^c{}_{45}-.005$ --, therefor.

Signed and Sealed this
Twentieth Day of May, 2025

Coke Morgan Stewart
*Acting Director of the United States Patent and Trademark Office*